US006255866B1

(12) United States Patent
Wolaver et al.

(10) Patent No.: US 6,255,866 B1
(45) Date of Patent: *Jul. 3, 2001

(54) DIGITAL PHASE ANALYZER AND SYNTHESIZER

(75) Inventors: Dan H. Wolaver, Westbrookfield, MA (US); Daniel G. Knierim, Beaverton, OR (US)

(73) Assignee: Tektronix, Inc., Beaverton, OR (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/322,951

(22) Filed: May 28, 1999

Related U.S. Application Data

(60) Provisional application No. 60/087,185, filed on May 29, 1998.

(51) Int. Cl.[7] ........................................................ H03K 7/00
(52) U.S. Cl. .......................... 327/107; 327/105; 327/141; 327/552; 708/290; 708/276
(58) Field of Search ................................... 327/105, 107, 327/113, 552, 141; 375/118, 261, 249; 708/271, 276, 290; 341/143, 144

(56) References Cited

U.S. PATENT DOCUMENTS

| 4,059,806 | | 11/1977 | Vagt, Jr. .............................. 329/107 |
| 4,233,684 | * | 11/1980 | Eggermont ............................ 375/30 |
| 4,484,296 | | 11/1984 | Treise et al. ......................... 364/607 |
| 4,933,890 | | 6/1990 | Nuytkens et al. .................... 364/721 |
| 5,600,675 | * | 2/1997 | Engeler ................................. 375/261 |
| 5,627,500 | | 5/1997 | Wolaver et al. ..................... 332/112 |
| 5,748,126 | * | 5/1998 | Ma et al. ............................. 341/143 |
| 5,944,835 | | 8/1999 | Lusinchi et al. ..................... 713/501 |

* cited by examiner

Primary Examiner—Dinh T. Le
(74) Attorney, Agent, or Firm—Francis I. Gray; David N. Caracappa

(57) ABSTRACT

A digital phase synthesizer includes a source of successive phase data signals. An interpolator generates successive edge placement data signals in response to each of the successive phase data signals. A phase modulator generates an output clock signal having edges placed at times determined by the successive edge placement data signals. Similarly, a digital phase analyzer includes a source of an serial binary input signal having edges. A phase demodulator generates successive data signals representing the location of each edge of the serial binary input signal. A decimator generates phase data signals at a lower rate than the edges of the serial binary input signal.

5 Claims, 12 Drawing Sheets

| C | M | D0 | D1 | D2 | D3 | D4 | D5 | D6 | D7 |
|---|---|---|---|---|---|---|---|---|---|
| 0 | 0 | A1 | 8 | 8 | 8 | 8 | 8 | 8 | 8 |
| | 1 | 0 | A1 | 8 | 8 | 8 | 8 | 8 | 8 |
| | 2 | 0 | 0 | A1 | 8 | 8 | 8 | 8 | 8 |
| | 3 | 0 | 0 | 0 | A1 | 8 | 8 | 8 | 8 |
| | 4 | 0 | 0 | 0 | 0 | A1 | 8 | 8 | 8 |
| | 5 | 0 | 0 | 0 | 0 | 0 | A1 | 8 | 8 |
| | 6 | 0 | 0 | 0 | 0 | 0 | 0 | A1 | 8 |
| | 7 | 0 | 0 | 0 | 0 | 0 | 0 | 0 | A1 |
| >0,<256 | X | 8 | 8 | 8 | 8 | 8 | 8 | 8 | 8 |
| 256 | 0 | A2 | 0 | 0 | 0 | 0 | 0 | 0 | 0 |
| | 1 | 8 | A2 | 0 | 0 | 0 | 0 | 0 | 0 |
| | 2 | 8 | 8 | A2 | 0 | 0 | 0 | 0 | 0 |
| | 3 | 8 | 8 | 8 | A2 | 0 | 0 | 0 | 0 |
| | 4 | 8 | 8 | 8 | 8 | A2 | 0 | 0 | 0 |
| | 5 | 8 | 8 | 8 | 8 | 8 | A2 | 0 | 0 |
| | 6 | 8 | 8 | 8 | 8 | 8 | 8 | A2 | 0 |
| | 7 | 8 | 8 | 8 | 8 | 8 | 8 | 8 | A1 |
| >256 | X | 0 | 0 | 0 | 0 | 0 | 0 | 0 | 0 |

Fig. 8

| Fine res | DAC1 A1 | DAC2 A2 |
|---|---|---|
| 0 | 1 | 7 |
| 1 | 2 | 6 |
| 2 | 3 | 5 |
| 3 | 4 | 4 |
| 4 | 5 | 3 |
| 5 | 6 | 2 |
| 6 | 7 | 1 |
| 7 | 8 | 0 |

Fig. 9

DIGITAL PHASE ANALYZER AND SYNTHESIZER

CROSS-REFERRENCE TO RELATED APPLICATIONS

This application is a non-provisional application based on Provisional Application Ser. No. 60/087,185 filed May 29, 1998.

FIELD OF THE INVENTION

The present invention relates to a digitally controlled lock signal synthesizer and serial binary signal analyzer.

BACKGROUND OF THE INVENTION

Digitally controlled clock signal synthesizers are known. Systems known as arbitrary waveform generators include a source of a series of digital control signals representing the value of an output clock signal at that time. The rate at which the digital control signals are supplied is controlled by a system clock, which has a frequency generally substantially higher than that of the synthesized clock signal. These digital control signals are supplied to a digital-to-analog converter (DAC). The analog output signal from the DAC is low pass filtered and threshold detected. The output signal from the threshold detector is the synthesized clock signal.

For system clock periods when the synthesized clock signal is high, the digital signals have a maximum value, and for system clock periods when the synthesized clock signal is low, the digital signals have a minimum value. For system clock periods during which leading and trailing edges occur, the digital signals have intermediate values. The DAC generates an analog signal having levels corresponding to the values of the digital signals. For example, at a leading edge, the clock signal transitions from the minimum value of the preceding system clock cycle to the maximum value of the following system clock cycle. At the system clock period of a leading edge, a digital control signal having an intermediate value near the minimum value causes the low pass filtered analog signal to rise relatively slowly, so that signal crosses the threshold level relatively late. The leading edge, consequently, occurs relatively late in that system clock period. Conversely, a digital signal at an intermediate value near the maximum value causes the low pass filtered analog signal to rise relatively quickly, so that signal crosses the threshold level relatively early. In this case, the leading edge occurs relatively early in that system clock period. Trailing edges are placed in a similar manner. In this manner, a digital clock signal may be synthesized with leading and trailing edges placed at fractional locations within a system clock period.

Such a system can generate a synthesized clock signal having edges placed accurately with relatively high resolution. However, such a system requires a system clock frequency which is substantially higher than the frequency of the synthesized clock signal. Should a synthesized clock be required at a relatively high frequency, then such a system would require an extremely high frequency system clock signal, and a correspondingly high speed source of digital control signals, DAC, low pass filter, and threshold detector. Such high frequency components would be very expensive, or even technologically impossible.

Other techniques for providing synthesized clock signals having accurately placed edges with relatively high resolution, but not requiring high speed components have been developed. For example, U.S. Pat. No. 5,394,106, entitled APPARATUS AND METHOD FOR SYNTHESIS OF SIGNALS WITH PROGRAMMABLE PERIODS, issued Feb. 28, 1995 to Black et al., discloses such a system. The system disclosed in this patent includes a source of a series of digital control signals, a counter clocked by a system clock, a magnitude comparator, and a variable delay circuit. The digital control signals represent the time from the last generated edge to the next desired edge. One portion of each digital control signal represents the integer number of system clock cycles from the preceding edge to the desired time location of the next edge of the synthesized clock signal. A second portion of each digital control signal represents a fractional portion of a system clock cycle from the preceding edge to the desired time location of the next edge. The digital control signals are coupled through an accumulator to one input terminal of the magnitude comparator and the value from the counter is applied to the second input terminal of the magnitude comparator. The counter counts system clock cycles, and when the required number of clock cycles have been counted (i.e. when the desired count has been reached), the magnitude comparator produces a logical '1' signal to indicate a match. The fractional portion of the digital control signal, then, conditions the variable delay circuit to delay the logical '1' output signal from the magnitude comparator for the required portion of a system clock cycle. The delayed output signal from the variable delay circuit places an edge in the synthesize clock signal.

The system of U.S. Pat. No. 5,394,106 can place edges in a synthesized clock signal at a fractional resolution of the system clock cycle, without requiring the frequency of the system clock signal to be substantially higher than that of the synthesized clock signal. Instead, the frequency of the system clock signal need only be of the same order as the highest frequency desired in the synthesized clock signal. However, in systems such as the system of U.S. Pat. No. 5,394,106, a new digital control signal is requested from the digital control signal source in response to the 'match' signal from the magnitude comparator, that is when the edge corresponding to the last digital control signal has been generated. Because such a system can be used, and is intended to be used, to generate a phase modulated synthesized clock signal (as for jitter response measurement), the requests for new digital control values occur at varying time periods. In other words, input digital control values are received asynchronously with respect to the system clock.

One skilled in the art will understand, however, first that synchronous digital systems are easier to design, implement, and integrate into other digital systems. The asynchronicity of the U.S. Pat. No. 5,394,106 system makes integrating such a system into a digital system difficult. Second, asynchronous systems make accurate filtering difficult to design and implement. Thus, a clock signal synthesizer which permits accurate and high resolution edge placement, without requiring a system clock having a frequency substantially higher than that of the synthesized clock signal, and which operates in a synchronous manner (i.e. receiving digital control signals synchronously with the system clock) is desirable.

Clock signal analyzers are also known. Such analyzers generate data representing the phase of the input clock signal. In a corresponding manner to the clock signal generator described above, one clock signal analyzer includes a counter which is started at one edge of the input clock signal, and stopped at the next edge. The counter is clocked by a system clock, and the count at the end of the counting period gives an indication of the time between the two edges.

The above method has the resolution of the system clock period. A method for achieving finer resolution includes two ramp generators for the purpose of achieving finer resolution than the system clock. Pulses are used to indicate the locations of edges in the clock signal being analyzed. A start pulse triggers a ramp generator which is constructed to traverse from a minimum voltage to a maximum voltage during a system clock period. This ramp generator continues until the beginning of the next system clock cycle. The value of the ramp signal at the start of the next system clock cycle is converted to a digital signal, and is an indication of the fraction of a clock cycle from the start pulse to the start of the next system clock cycle: a low value indicates that the start pulse occurred near the end of the system clock cycle and a high value indicates that the start pulse occurred just after the start of the system clock cycle. The start pulse also enables a counter which begins to count system clock cycles. A stop pulse disables the counter and triggers a second ramp generator. The second ramp generator operates in a similar manner to the first ramp generator and generates a digital value indicating the fraction of a system clock cycle from the stop pulse to the start of the next system clock cycle. The value of the second ramp generator is also converted to a digital value. The time duration between the start pulse and the stop pulse, thus, can be determined as the number of system clock cycles in the counter, plus the fraction of a clock cycle between the start pulse and the first full system clock cycle represented by the digital value of the first ramp generator, minus the fraction of the clock cycle between the stop pulse and the next full system clock cycle represented by the digital value of the second ramp generator.

It is not always necessary that each edge of a synthesized clock signal be specified, nor that the time of each edge of an input clock signal be analyzed. In some cases, it is sufficient that edge data be supplied, and edge timing data be received, at a lower rate than the rate of the edges in the synthesized or analyzed data signal.

BRIEF SUMMARY OF THE INVENTION

In accordance with principles of the present invention, a digital phase synthesizer includes a source of successive phase data signals. An interpolator generates successive edge placement data signals in response to each of the successive phase data signals. A phase modulator generates an output clock signal having edges placed at times determined by the successive edge placement data signals. Similarly, a digital phase analyzer includes a source of an serial binary input signal having edges. A phase demodulator generates successive data signals representing the location of each edge of the serial binary input signal. A decimator generates phase data signals at a lower rate than the edges of the serial binary input signal.

A clock signal synthesizer according to the present invention permits accurate and high resolution edge placement, without requiring a system clock having a frequency substantially higher than that of the synthesized clock signal, and which operates in a synchronous manner.

BRIEF DESCRIPTION OF THE DRAWING

In the drawing:

FIGS. 1(a) and 1(b) is a block diagram of a phase measurement/generator system for a serial binary signal;

FIGS. 8 and 9 are tables, all useful in understanding the operation of the phase modulator in the clock signal synthesizer illustrated in FIGS. 2 and 3;

FIGS. 14(a)–14(d) is a more detailed block diagram of a filter used in the serial binary input signal analyzer illustrated in FIG. 11.

DETAILED DESCRIPTION OF THE INVENTION

Figure 1:
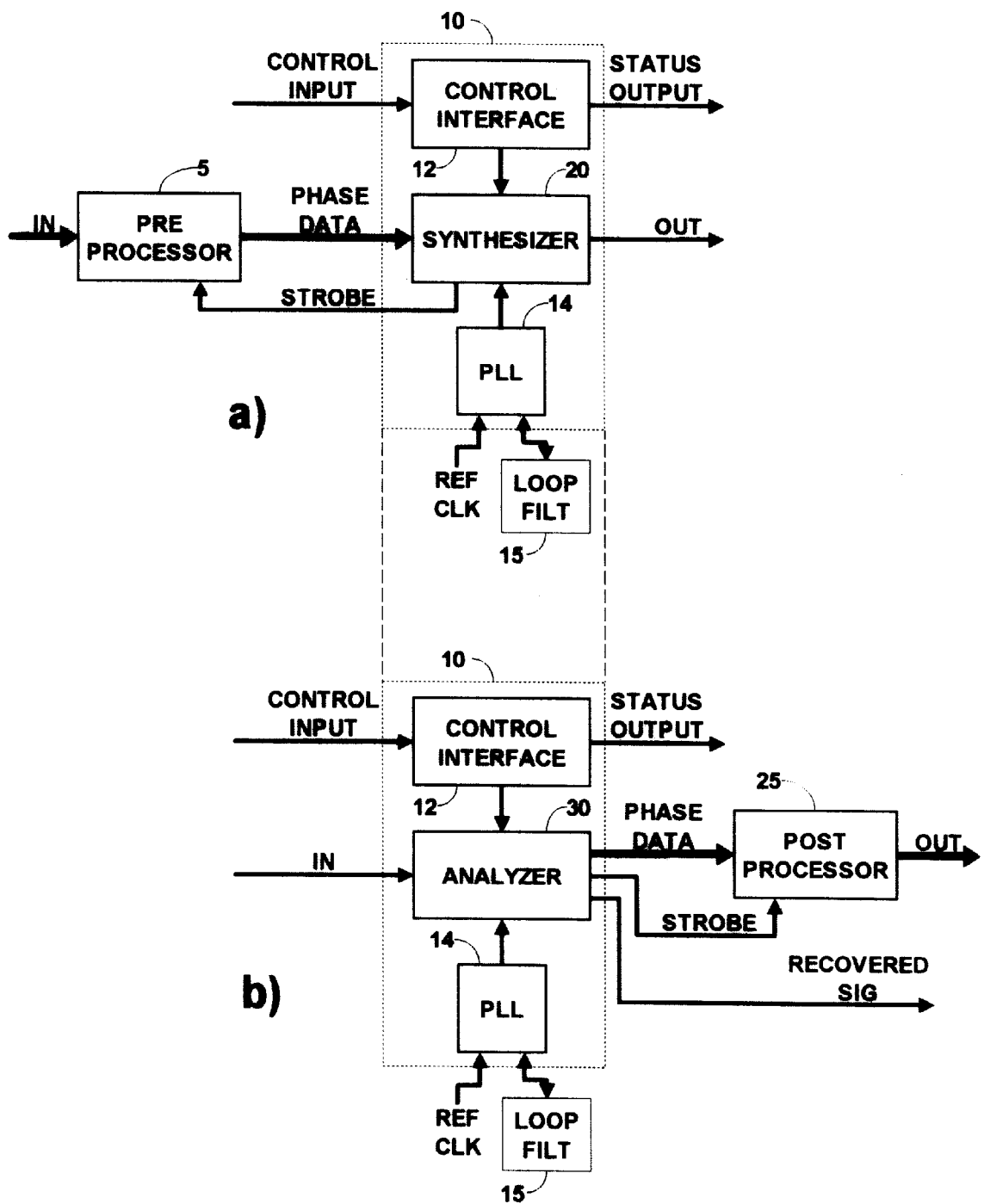
FIG. 1 including

FIG. 1 is a block diagram of a phase measurement/generator system 10 for a digital signal. The system illustrated in FIG. 1 is configurable. FIG. 1a is a block diagram of the system 10 configured to generate a clock output signal in response to phase data signals and FIG. 1b is a block diagram of the system 10 configured to measure the phase of a serial binary input signal. Those elements which are the same in FIGS. 1a and b are designated by the same reference number.

In FIG. 1a, an input terminal IN is coupled to a system controller (not shown) which produces signals specifying the desired phase characteristic of a generated clock output signal. The input terminal IN is coupled to an input terminal of a preprocessor 5. An output terminal of the preprocessor 5 is coupled to an input terminal of a phase synthesizer 20. A data output terminal of the phase synthesizer 20 is coupled to a clock output terminal CLK OUT, and a strobe signal output terminal STROBE of the phase synthesizer 20 is coupled to a corresponding input terminal of the preprocessor 5.

A control input terminal is coupled to the system controller (not shown) and receives data for controlling the configuration and operation of the system 10. The control input terminal is coupled to an input terminal of control interface circuit 12. A status output terminal of the control interface circuit 12 produces status signals representing the operating condition of the system 10 and is coupled to the system controller.

A reference clock signal REF CLK is coupled to a reference input terminal of a phase locked loop (PLL) 14. A loop filter 15 is also coupled to the PLL 14. The PLL 14 supplies clock signals to the various elements of the system 10, synchronized to the reference clock in a known manner. These clock signals are not illustrated in FIG. 1 to simplify the figure.

In FIG. 1b, an input terminal IN is coupled to a source of a serial binary input signal. The input terminal IN is coupled to an input terminal of a phase analyzer 30. A phase data output terminal of the phase analyzer 30 is coupled to a data input terminal of a post processor 25. An output terminal of the post processor 25 is coupled to an output terminal OUT generating data representing the detected phase characteristic of the serial binary input signal IN. A strobe output terminal STROBE of the analyzer 30 is coupled to a corresponding input terminal of the post processor 25. In addition, a recovered clock output terminal from the analyzer 30 is coupled to a recovered clock output terminal. The remainder of the system illustrated in FIG. 1b is identical to that illustrated in FIG. 1a. The system 10 in FIG. 1a is identical to that in FIG. 1b, as illustrated by the dashed lines connecting them between FIGS. 1a and 1b, in a manner to be described in more detail below.

In operation, the system controller (not shown) provides control data to the system 10 via the control input terminal. The control interface 12 receives and saves this information in any one of a variety of known manners. For example, the control input terminal could be coupled to a multibit parallel digital bus coupled to a microprocessor. Alternatively, in the illustrated embodiment, the control input terminal is a serial digital input terminal including a serial data signal line, a clock signal line, and possibly control lines for controlling flow of data to and from the control interface 12. The control interface 12 includes registers, coupled to the control input terminal, for saving values received from the control input terminal. Output terminals of the registers are coupled to the various circuits within the system 10 they control, all in a known manner.

Similarly, the control interface may contain registers, or latches, or transmission gates (as appropriate) whose input terminals are coupled to points in the system 10 whose values are to be monitored. The output terminals of these circuits are coupled to the status output terminal. In addition, the registers described above, containing the control values, may also have their output terminals coupled to the status output terminal. It is also possible that such control registers be shared, some holding control values and others supplying status values. As with the control input terminal, the status output terminal could be a multibit parallel digital bus, or as in the illustrated embodiment, a serial signal line including a data signal line, a clock signal line, and possibly control lines. The system controller (not shown) can read the data from these circuits to determine the current status of the system 10, all in a known manner.

In FIG. 1a, the system controller (not shown) has supplied control data to the control interface 12 to configure the system 10 to operate as a clock output signal generator, in a manner to be described in more detail below. In this mode of operation, the synthesizer 20 sends a strobe signal to the preprocessor 5 when new phase data is required. In response to this strobe signal, the preprocessor 5 supplies data (PHASE DATA) representing a desired phase characteristic of the clock output signal CLK OUT to the synthesizer 20. As will described in more detail below, the preprocessor 5 may perform substantive signal processing in conjunction with the phase synthesizer 20, or may simply pass the input phase characteristic signal directly from the input terminal IN to the phase synthesizer 20 without substantive processing. In the illustrated embodiment, however, the preprocessor 5 performs relatively low-speed signal processing in conjunction with relatively high-speed circuitry in the phase synthesizer 20 in a manner to be described below.

The synthesizer 20 generates a clock output signal CLK OUT having edges placed according to the phase data received from the preprocessor 5. The clock output signal CLK OUT has edges occurring at substantially a predetermined rate (baud), including phase modulation of those edges. The phase data from the preprocessor 5, however, is requested (via the STROBE signal) at a constant rate, which may be less than the predetermined (baud) rate of the edges in the output serial binary signal OUT, all in a manner described in more detail below. That is, the generated edges in the clock output signal CLK OUT occur asynchronously with respect to the phase data from the preprocessor 5.

In FIG. 1b, the system controller (not shown) has supplied control data to the control interface 12 to configure the system 10 to operate as a serial binary input signal measurement system, in a manner to be described in more detail below. In this mode of operation, the analyzer 30 receives the serial binary input signal IN which has edges occurring substantially at a predetermined rate (baud), but phase modulated. The analyzer 30 calculates data representing the time elapsed from each edge to the next successive edge in the serial binary input signal IN, and generates a sequence of phase representative data signals PHASE DATA representing the phase characteristic of the serial binary input signal IN received by the analyzer 30. These phase representative data signals PHASE DATA are made available to the post processor 25, along with a strobe signal STROBE to indicate that new phase representative data PHASE DATA is available. In response to the strobe signal STROBE, the postprocessor 25 receives the phase representative data PHASE DATA and generates an output signal OUT representing the phase characteristic of the serial binary input signal. In a similar manner to the preprocessor 5 described above, the post processor 25 may perform substantial signal processing, or may pass the phase data output signal PHASE DATA directly from the analyzer 30 to the phase characteristic output terminal OUT without any substantial signal processing. However, in the illustrated embodiment, the post processor 25 performs relatively low speed signal processing in conjunction with the relatively high speed signal processing performed in the analyzer 30, in a manner described below.

Similarly to the digital clock generation system described above with reference to FIG. 1a, the phase data is supplied to the postprocessor 25 (via the STROBE signal) at a constant rate, while the edges in the serial binary input signal occur substantially at a predetermined rate (baud), though phase modulated, all in a manner described in more detail below. Thus, the phase data is generated asynchronously to the edges in the serial binary input signal. In addition, in the illustrated embodiment, the analyzer 30 also generates a recovered clock signal RECOVERED CLK which has substantially the same phase as the received serial binary input signal IN.

Figure 2:
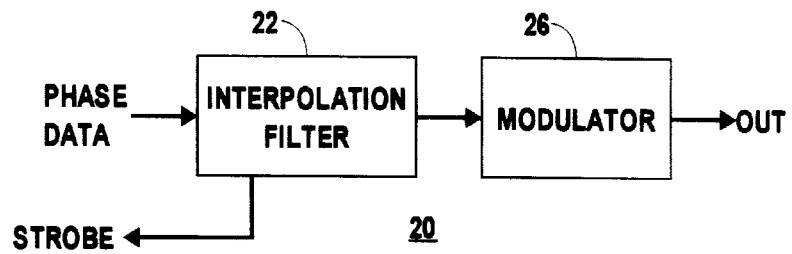
FIG. 2 is a block diagram of a clock signal synthesizer which may be used in the system illustrated in FIG. 1.

FIG. 2 is a block diagram of a clock signal synthesizer 20 which may be used in the system 10 illustrated in FIG. 1. In FIG. 2, phase data from the preprocessor 5 (FIG. 1) is coupled to an input terminal of an interpolation filter 22. A strobe signal output terminal of the interpolation filter 22 is coupled to the corresponding input terminal of the preprocessor 5. A data output terminal of the interpolation filter 22 is coupled to an input terminal of a phase modulator 26. An output terminal of the phase modulator 26 is coupled to the clock signal output terminal CLK OUT.

In operation, the interpolation filter 22 requests phase data from the preprocessor 5 by activating the strobe signal STROBE. In response to the strobe signal STROBE, the preprocessor 5 supplies data representing the desired phase characteristic of the clock output signal CLK OUT, in a known manner, as described above. The interpolation filter 22, then generates successive edge placement data signals, each such signal specifying the location of one edge in the clock output signal CLK OUT. In this manner, the interpolating filter 22 generates edge placement signals which will condition the phase modulator 26 to generate a clock output signal having a phase characteristic which smoothly changes from the characteristic represented by the previous phase data signal from the preprocessor 5 to that represented by the last received phase data signal, in a manner described in more detail below. The phase modulator 26 generates the clock output signal CLK OUT having edges placed in response to each of the edge placement signals from the interpolation filter 22.

Figure 3:
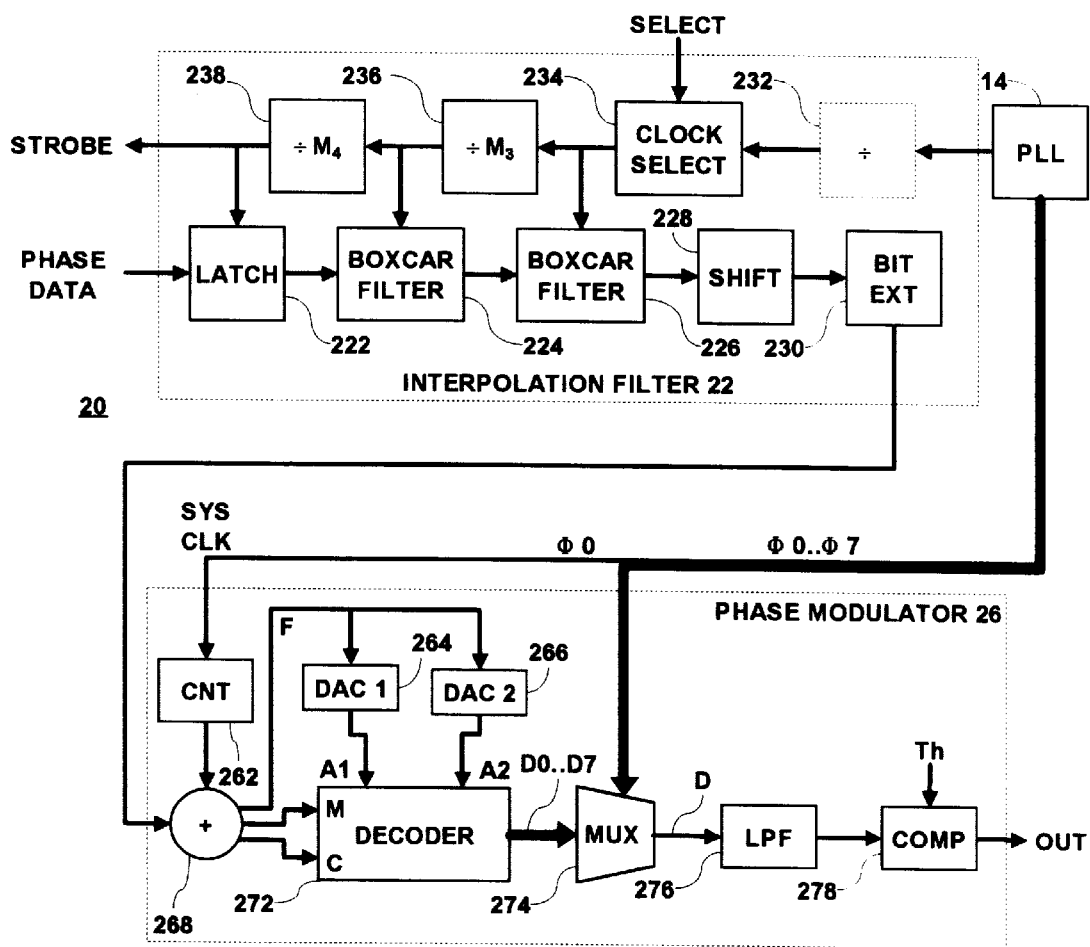
FIG. 3 is a more detailed block diagram of a clock signal synthesizer as illustrated in FIG. 2.

FIG. 3 is a more detailed block diagram of a serial binary signal synthesizer 20 as illustrated in FIGS. 1 and 2. In FIG. 3, phase data from the preprocessor 5 (of FIG. 1) is coupled to a data input terminal of an interpolator 220. An output terminal of the interpolator 220 is coupled to an input terminal of a bit extender 230. A system clock signal, described in more detail below, from the PLL 14 is coupled to an input terminal of a frequency divider 232 (shown in phantom for reasons discussed below). An output terminal of the divider 232 is coupled to a data input terminal of a clock selector 234. An output terminal of the clock selector 234 is coupled to a clock input terminal of the interpolator 220. A strobe output terminal of the interpolator 220 is coupled to the STROBE output terminal of the interpolation filter 20. The combination of the interpolator 220, bit extender 230, frequency divider 232 and clock selector 234 form the interpolation filter 22.

The PLL 14 also generates a multiphase clock signal at the system clock frequency. In the illustrated embodiment, the multiphase clock signal includes clock signals having phases Φ0 to Φ7. The first phase, Φ0, of the multiphase clock signal is selected to be the system clock SYS CLK signal, and is coupled to an input terminal of a counter 262.

An output terminal of the bit extender 230 is coupled to a first input terminal of an adder 268. Respective first and second output terminals of the adder 268 are coupled to corresponding first and second control input terminals of a decoder 272. An output terminal of the decoder 272 is coupled to a data input terminal of an analog multiplexer (MUX) 274. An output terminal of the MUX 274 is coupled to an input terminal of a low pass filter 276. An output terminal of the low pass filter (LPF) 276 is coupled to a data input of a comparator 278. An output terminal of the comparator 278 is coupled to the output terminal of the synthesizer 20 and produces the clock output signal CLK OUT.

A third output terminal of the adder 268 is coupled to respective input terminals of a first digital-to-analog converter (DAC) 264, and a second DAC 266. Respective output terminals of the first and second DACs 264 and 266 produce signals A1 and A2 and are coupled to corresponding input terminals of the decoder 272. All phases of the multiphase system clock signal, Φ0 to Φ7, are coupled to a control input terminal of the analog MUX 274. The combination of the counter 262, the first and second DACs 264 and 266, the adder 268, the decoder 272, the MUX 274, the LPF 276 and the comparator 278 form the phase modulator 26.

Figure 4:
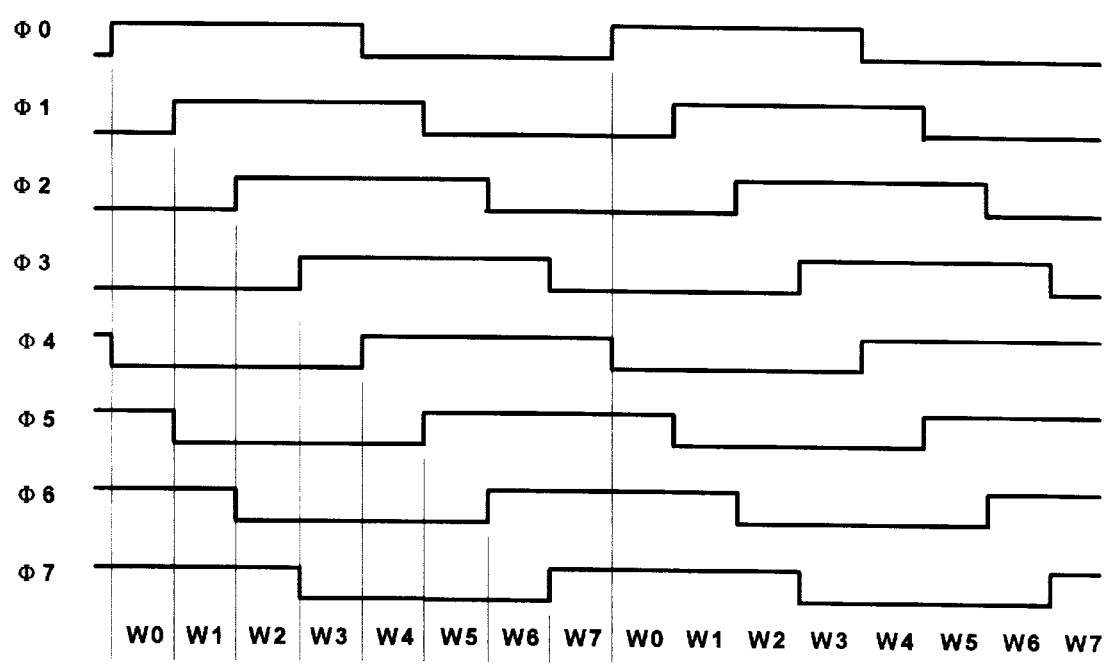
FIG. 4 is a waveform diagram useful in understanding the operation of the phase measurement/generator system according to the present invention.

The multiphase system clock signal from the PLL 14 (of FIG. 1) is illustrated in FIG. 4. In the illustrated embodiment, the multiphase system clock includes 8 clock signals having the same frequency, but at 8 equally spaced phases, respectively, in order to simplify the description of the invention. The multiphase system clock signal may be generated by a ring oscillator in a known manner. It is also possible for the multiphase system clock signal to include more or fewer than eight phases. One phase of the multiphase system clock signal is selected to provide a system clock signal. In the illustrated embodiment, Φ0 is used as the system clock.

The divider 232 in the interpolation filter 22 receives the system clock signal from the PLL 14, and generates a plurality of clock signals at respective submultiples of the system clock signal frequency (i.e. 1/2, 1/4, 1/8, etc. of the system clock frequency). In a preferred embodiment, nine such clock signals are generated by the divider 232. These nine divided clock signals, and the system clock signal, are supplied to the clock selector 234, which selects one of those signals as the clock signal for the interpolator 220.

The interpolation filter 22 is a low pass filter which interpolates between the received phase data signals, which are relatively sparse, to generate the edge placement data signals nominally at the baud. This arrangement permits a wide range of phase data input rates from relatively low rates of 1.5 MHz, up to a frequency as high as 700 to 1400 MHz. In the illustrated embodiment, the interpolation filter 22 is arranged, in a known manner, to provide for interpolation of the output edge placement data signal between the received phase data signals.

Figure 5:
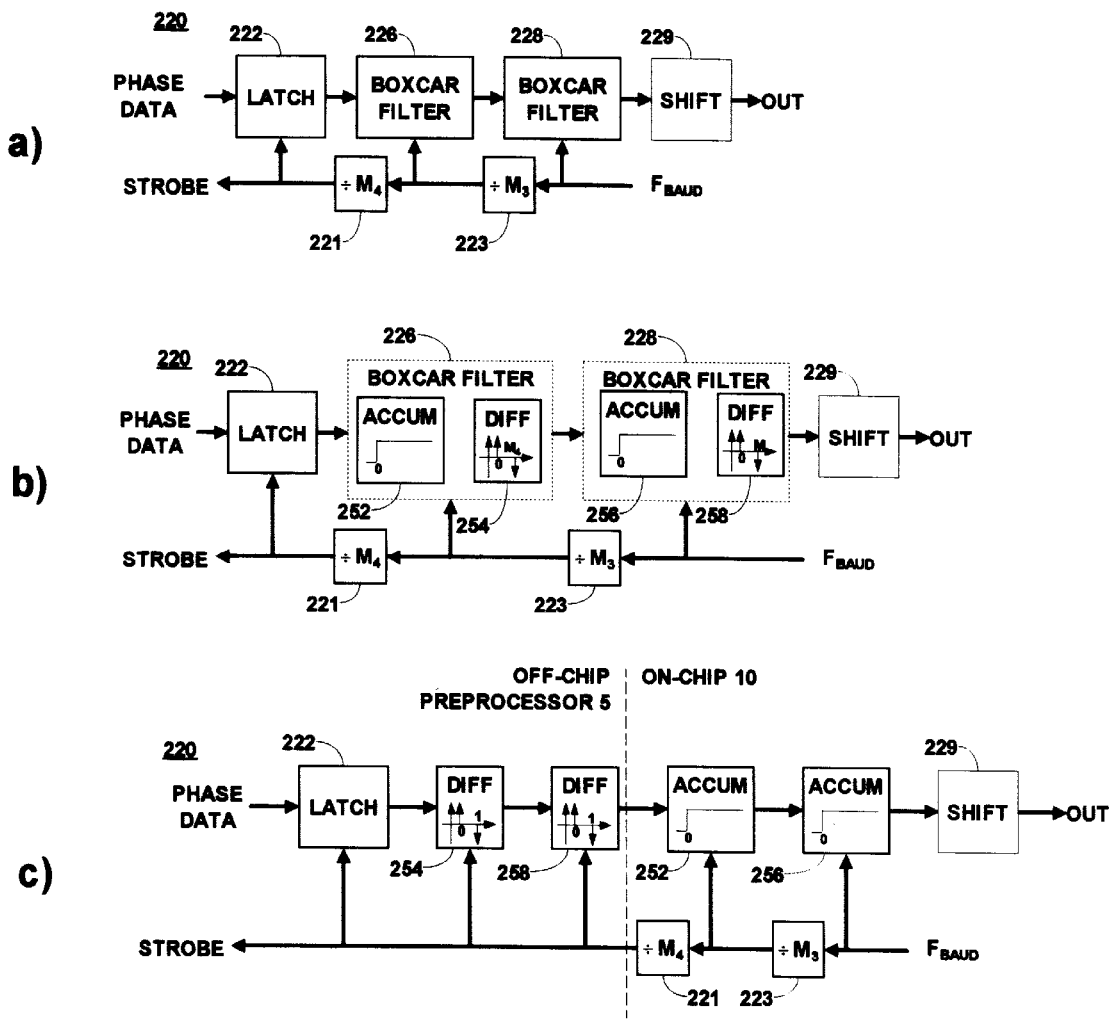
FIG. 5 is a more detailed block diagram of an interpolator which may be used in the clock signal synthesizer of FIG. 3.

FIG. 5 is a more detailed block diagram of an interpolator 220 which may be used in the clock signal synthesizer 20 of FIG. 3. FIG. 5 illustrates three block diagrams of the interpolator 220. In FIG. 5a, phase data from the preprocessor 5 is coupled to an input terminal of a latch 222. An output terminal of the latch 222 is coupled to an input terminal of a first boxcar filter 226. An output terminal of the first boxcar filter 226 is coupled to an input terminal of a second boxcar filter 228. An output terminal of the second boxcar filter 228 is coupled to an input terminal of a funnel shifter 229. An output terminal of the funnel shifter 229 is coupled to an output terminal OUT of the interpolator 220, which is coupled to the phase modulator 26 (of FIG. 2). A clock signal, illustrated as being at baud $F_{BAUD}$, from the clock selector 234 (of FIG. 3) is coupled to a clock input terminal of the second boxcar filter 228 and to an input terminal of a fixed frequency divider 223. An output terminal of the fixed frequency divider 223 is coupled to a clock input terminal of the first boxcar filter 226 and an input terminal of a second fixed frequency divider 221. An output terminal of the second fixed frequency divider 221 is coupled to a clock input terminal of the latch 222 and the strobe output terminal STROBE of the interpolator 220.

Boxcar filters are well known, and have flat impulse response characteristics over a predetermined time period. One skilled in the art will recognize that such a filter provides a linear interpolation of the input signal and an amplification. Two such boxcar filters in series, and operating over the same time duration will provide a quadratic interpolation function and amplification. One skilled in the art will also recognize that other interpolation schemes could be used as well.

In operation, the latch 222 receives phase data from the preprocessor 5 and latches it in response to the strobe signal STROBE from the second fixed frequency divider 221. The strobe signal STROBE is derived directly from the system clock signal through frequency division by the frequency divider 232 and clock selector 234 (of FIG. 3) and the first and second fixed frequency dividers 223 and 221.

Consequently, phase data is received in synchronism with the system clock, and is not in response to the timing of any generated edges. The latched phase data is supplied to the serial connection of the first and second boxcar filters 226 and 228. The first and second boxcar filters provide quadratic interpolation and amplification of the phase data signals and generate a series of successive edge placement signals at baud. The successive edge placement signals are supplied to the phase modulator 26 (of FIG. 2).

The output of the second boxcar filter 228 is a multibit digital number having a predetermined number of bits. The funnel shifter 229 operates to attenuate the amplitude of the samples from the second boxcar filter by selecting a subset of the bits, and shifting them by an amount dependent on the clock factors $M_3$ and $M_4$, in a known manner. The output from the funnel shifter 229 is coupled to the bit extender 230 (of FIG. 3).

One skilled in the art will understand that a boxcar filter can be decomposed into a serial connection of an accumulator and a differencer. One skilled in the art will also understand that because the operations of the accumulator and differencer are linear operations, they can be arranged in any order. Further more, it will be understood that the accumulation operation is a relatively high speed operation, and the differencing operation is a relatively low speed operation.

FIG. 5b illustrates the interpolator 220 of FIG. 5a in which the first boxcar filter 226 is decomposed into a serial connection of an accumulator 252 and a differencer 254, and the second boxcar filter 228 is decomposed into a serial connection of an accumulator 256 and a differencer 258. It is shown in block 258 that the differencer 258 operates on samples separated by M samples, and the differencer 254 operates on samples separated by $M_4$ samples. However, because $M=M_3 \cdot M_4$, and the clock signal supplied is divided by the factor $M_3$ by the first fixed frequency divider 223, the time period over which the differencer 254 operates is the same as that over which the differencer 258 operates.

FIG. 5c illustrates another arrangement of the interpolator 220 in which the two differencers 254 and 258 are coupled directly after the latch 222, followed by the two accumulators 252 and 256. In this case the differencers operate on adjacent samples (separated by one sample), but because they are clocked by the strobe signal, which is divided by M by the series connection of the first and second fixed frequency dividers 223 and 221, they still operate over the same time period. The arrangement of FIG. 5c, however, has placed the relatively low speed differencing operations separate from the relatively high speed accumulating operations. Consequently, the latch 222, and the two differencers 254 and 258 can be placed outside of the integrated circuit chip on which the system 10 is fabricated. These elements are placed in the preprocessor 5, as described above. The higher speed accumulators are maintained on the integrated circuit chip containing the system 10. By moving low speed elements off of the integrated circuit chip containing the system 10, the circuit elements, and the surface area required, in the integrated circuit chip is reduced.

Referring again to FIG. 3, the bit extender 230 receives the output signal from the funnel shifter 229 (of FIG. 5). The bit extender 230 extends the number of bits in the output signal from the funnel shifter 229, and performs a low pass filtering operation. For example, in the illustrated embodiment, the bit extender 230 generates a signal having 15 bits. In a preferred embodiment, more bits may be required, depending on the configuration of the circuitry described in more detail below. In the illustrated embodiment, the filtering is performed by a first order low pass filter, fabricated in the illustrated embodiment by an IIR filter. The bit extender 230 supplies that output signal to the phase modulator 26.

The signal from the bit extender 230 may be considered to be a fixed point real number representing the desired amount of time difference between the next edge of an unmodulated clock signal at baud to the next edge of the synthesized clock output signal. That is, the signal from the bit extender 230 includes an integer portion of fixed bit width, and a fractional portion also of fixed bit width. This real number may be positive or negative. The integer portion represents the number of whole system clock periods between the desired time location of the next edge of the synthesized clock signal and the time location of the next edge of the unmodulated clock signal, and the fractional portion represents the fraction of a system clock period between the desired time location of the next edge of the synthesized clock signal and that of the unmodulated clock signal.

In the illustrated embodiment, the system clock frequency is related by a power of two to the baud. That is if baud is $F_{BAUD}$, then the system clock frequency is $2^m \cdot F_{BAUD}$. In this case, each cycle of a clock signal at baud includes $2^m$ system clock cycles. The value of m may be selected by the system controller via the control interface 12. The counter 262 is configured, in response to control signals from the system controller via the control interface 12, to conform to the selected value of m by being configured into an m-bit counter. The m-bit counter 262 is responsive to one of the phases in the multiphase system clock signal: in the illustrated embodiment, phase Φ0. Consequently, the output from the m-bit counter 262 is an m-bit digital signal which counts at the system clock rate and cycles at baud starting with a count of 0 at the beginning of the cycle, a count of $2^{m-1}$ in the middle of the cycle, and a count of $2^m-1$ at the end, just before restarting at 0.

The size of the counter, and the value of m, are configured to provide a clock signal to the interpolator 220 at the desired baud from the system clock frequency. At the same time, the clock selector 234 is configured to select the divide by $2^m$ output from the clock divider 232. In this configuration, the clock signal from the clock selector 234 is at baud. This is usually desirable, though other configurations may also be selected.

For example, if the system clock frequency supplied by the PLL 14 is 1228.8 MHz, and the desired baud is 2.4 MHz, then m is selected to be 9. The counter 262 is configured to be a 9 bit counter, counts at the system clock rate, and cycles at baud, having a count of 0 at the beginning of a cycle, a count of 256 at the middle of a cycle and a count of 511 at the end of a cycle before restarting at 0.

Figure 6:
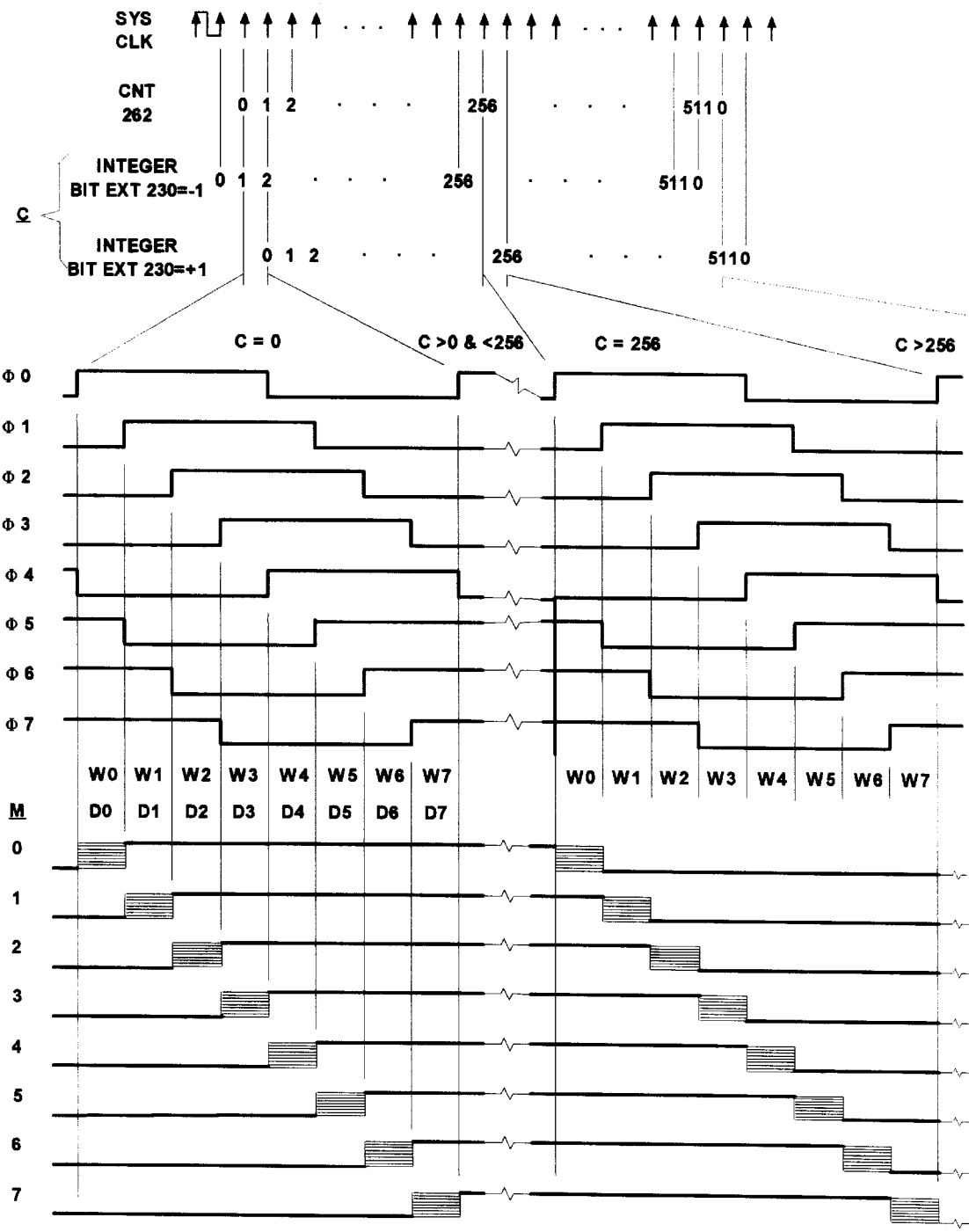
FIGS. 6 and 7 are waveform diagrams.
Figure 7:
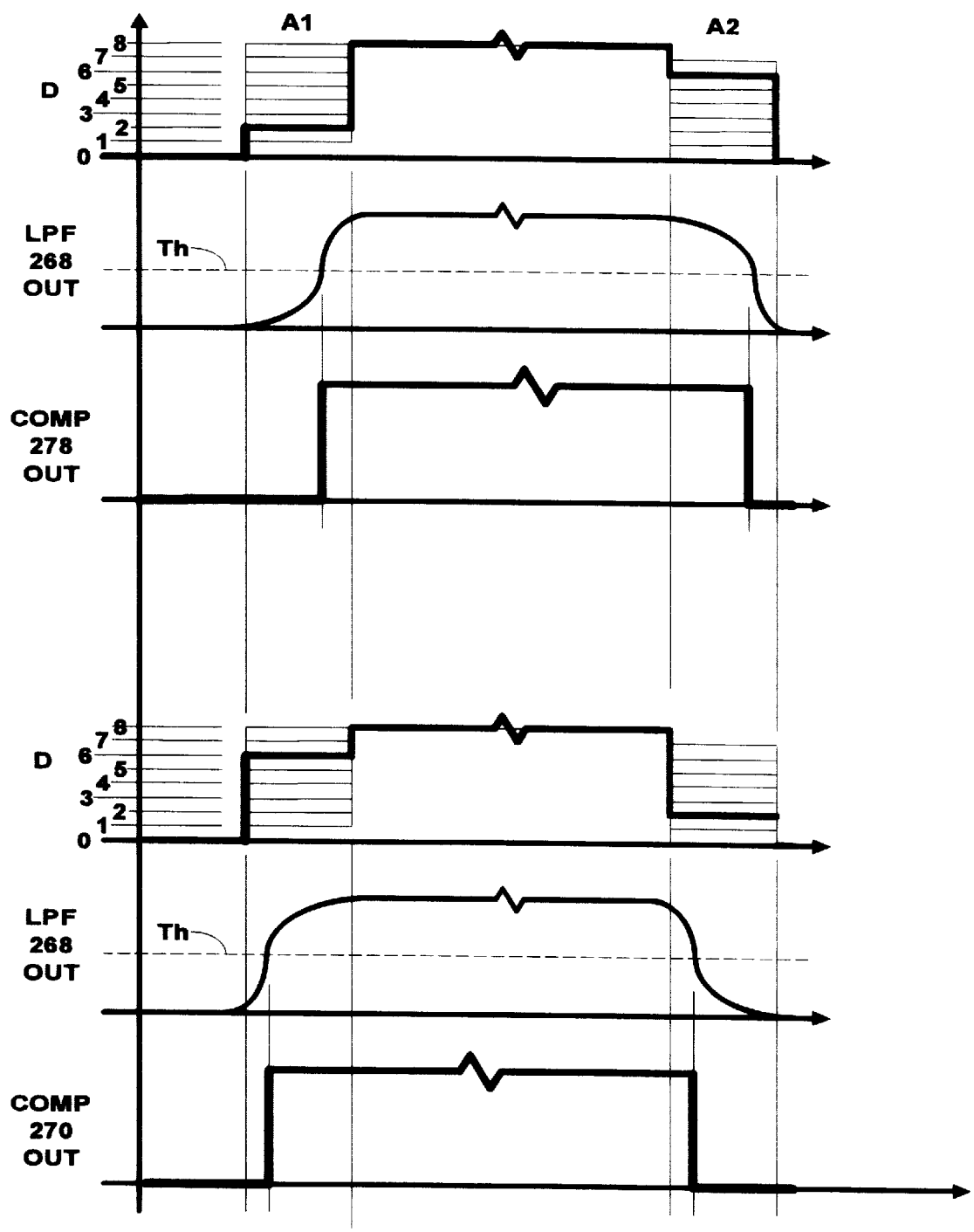

The operation of the phase modulator 26 may be better understood by referring to the waveform diagrams illustrated in FIGS. 6 and 7. The topmost waveform in FIG. 6 represents rising edges of the system clock signal SYS CLK, which, as described above, is Φ0 of the multiphase system clock signal. The system clock signal SYS CLK conditions the counter 262 to count and cycle from 0 to 511 and back to 0. This is shown in the second waveform in FIG. 6 (CNT 262) illustrating the values of the multibit output terminal of the counter 262 corresponding to respective leading edges of the system clock signal SYS CLK.

The signal from the bit extender 230 of the interpolation filter 22, represents the time difference between the time location of the next desired edge in the clock output signal and the time location of the next edge in a nominal clock signal at the baud, and is expressed as a fixed point real number having an integer and fractional portion, all as described above. This signal is combined with the output of the counter 262 in adder 268. As described above, the integer portion of the fixed point real number represents an integral number of system clock cycles, and the output signal from the counter 262 also represents an integral number of system clock cycles. The signal from the counter 262 is, thus, considered to be a fixed point real number having only an integer portion and a zero-valued fractional portion. In a preferred embodiment, the output of the counter 262 is subtracted from the time difference signal from the bit extender 230. Consequently, the output of the adder 268 is a number which counts down from 0 to 511, then down through 256, then down through 1 back to 0. The direction of counting, however, does not affect the generation of the edges since 0 and 256 are the same time duration apart whether the count is forward or backward.

The difference signal from the adder 268 is also considered to be a fixed point real number having an integer portion and a fractional portion. This signal controls the placement of the next edge of the clock output signal in the following manner. The integer portion of this signal is termed a coarse resolution signal, and is coupled to the first control input terminal C of the decoder 272. A most significant portion of the fractional portion is a medium resolution signal, and is coupled to the second control input terminal M of the decoder 272. In the illustrated embodiment, the medium resolution signal is a three bit signal. However, in a preferred embodiment, the medium resolution signal may have more than three bits. The next most significant portion of the fractional portion is a fine resolution signal and is coupled to the respective input terminals of the first and second digital-to-analog converters (DACs) 264 and 266. In the illustrated embodiment, the fine resolution signal F is also a three bit signal. However, in a preferred embodiment, the fine resolution signal may have more than three bits.

If the time difference signal from the bit extender 230 is positive, then the value of the output of adder 268 is greater than the value of the output of the counter 262, and if the time difference signal is negative, then the value of the output of adder 268 is less than the value of the output of the counter 262. The third waveform in FIG. 6 illustrates the integer (coarse resolution C) output of the adder 268 when the integer portion of the time difference signal is +1. When the output value of the counter 262 is subtracted from +1, the result is one greater than the value of the counter 262. The fourth waveform in FIG. 6 illustrates the integer (coarse resolution C) output of the adder 264 when the integral portion of the time difference signal is −1. When the output value of the counter 262 is subtracted from −1, the result is one less than the value of the counter 262.

As will be described in more detail below, the leading edge of the clock output signal CLK OUT is generated during the time interval when the integer output of the adder 268 is 0 and the trailing edge is generated during the interval when the integer output of the adder 268 is 256. The adder 268, in combination with the counter 262, permits the edge locations, and thus the phase of the generated clock output signal CLK OUT, to be shifted by an integral number of system clock cycles. In the following description, however, it will be assumed that the integer portion of the time difference signal is equal to 0 and the integer value from the adder 268 (coarse resolution C) is, thus, equal to the value from the counter 262.

The next eight waveforms in FIG. 6 represent the multiphase system clock signal, phases Φ0 through Φ7. The left hand portion of these waveforms represent those signals for the system clock cycle when the integer output value of the adder 268, C, equals 0, during which interval the leading edge of the clock output signal CLK OUT will be generated, and the right hand portion represents those signals when C equals 256 (trailing edge of the clock output signal CLK OUT). There are eight subintervals within a single clock cycle, labeled W0 through W1, defined by the relative phases of the respective signals in the multiphase clock signal, as illustrated in FIG. 6. Circuitry for generating respective binary signals representing each of the intervals W0 to W7, or a digital count signal having values representing respective ones of the intervals W0 to W7, may be designed and implemented by one skilled in the art in a known manner.

The decoder 272 operates to generate eight signals D0 through D7 in a manner to be described in more detail below. The table illustrated in FIG. 9 is useful in understanding the operation of the decoder 272. In the table of FIG. 9, the leftmost column represents the coarse resolution value C (integer value from the adder 268), and the second row represents the medium resolution value M (most significant three bits of the fractional portion of the value from the adder 268). The rightmost columns represent the signals D0 through D7 produced by the decoder 272. The D0 through D7 signals are multilevel analog signals. In the illustrated embodiment, these signals have nine possible levels, although in a preferred embodiment there may be more than nine levels. The level of these signals may be defined by values ranging from 0, representing the minimum level, to 8, representing the maximum level.

The analog multiplexer (MUX) 274 is responsive to the multiphase system clock signal to cycle through the signals D0 through D7 in order once each system clock cycle. During the phase interval W0, the MUX 274 couples the D0 signal to its output terminal; during the phase interval W1, the MUX 274 coupled the D1 signal to its output terminal, and so forth.

The configuration of signals D0 through D7 produced by the decoder 272 depends on the C and M values from the adder 268. The particular values of the signals D0 through D7 produced by the decoder 272 are represented by the columns D0 through D7 in the table of FIG. 9. During the time interval when the C value is greater than 0 but less than 256, illustrated in the middle row of the table in FIG. 9, all of these multilevel analog signals D0 through D7 have the value 8 regardless of the value of the medium resolution signal M (denoted by an "X" in the M column, meaning 'do-not-care'). During this interval, the decoder 272 couples a source of an analog signal having the level 8 to all of the output terminals D0 through D7. The signal produced by the MUX 274 during this interval, thus, has a constant value 8. During the time interval when the output of the adder 268 is greater than 256 but has not wrapped around to zero, illustrated at the bottommost row of the table in FIG. 9, all of these multilevel analog signals D0 through D7 have the value 0 regardless of the value of the medium resolution signal M. During this interval, the decoder 272 couples a source of an analog signal having the level 0 to all of the output terminals D0 through D7. The signal produced by the MUX 274 during this interval, thus, has a constant value 0.

The interval when the C signal is equal to 0 is illustrated in the eight rows in the top half of the table in FIG. 9, and the waveforms at the left side of FIG. 6. During this interval the signals D0 through D7 are formed in the following manner. If the medium resolution signal M is 0, then the signal D0 may assume any one of analog levels 1 through 8 (illustrated by multiple horizontal lines for signal D0 in FIG. 6). The particular analog level is derived from the signal A1 from the first DAC 264, represented by the entry "A1" in the column of the table of FIG. 9 representing signal D0 in the row representing a C signal of 0 and an M signal of 0. In the illustrated embodiment, the decoder 272 couples the output of the first DAC 264 to the D0 output terminal during this time interval. For C equal to 0 and M equal to 0, the signals D1 through D7 assume the analog level 8. The decoder 272 couples the source of an analog signal having the level 8 to the D1 through D7 output terminals. When the MUX 274 scans through signals D0 through D7, as described above, the left hand portion of the signal labeled "0" in FIG. 6 is generated, and the leading edge occurs during the phase interval W0, in a manner to be described in more detail below.

If the medium resolution signal is equal to 1, the D0 signal is set to an analog value of 0. The signal D1 may assume analog levels 1 through 8 (signal A1 from the first DAC 264); and the remaining signals D2 through D7, assumes the analog value 8, as illustrated in FIG. 9. When the MUX 274 scans through signals D0 through D7, as described above, the left hand portion of the signal labeled "1" in FIG. 6 is generated, and the leading edge occurs during the phase interval W1. Similarly, when the M signal has values 2 through 7, signals D2 through D7, respectively, have variable analog values 1 to 8 from signal A1 from the first DAC 264. Values of preceding Dx signals have analog values 0 and following Dx signals have analog values 8. When the MUX 274 scans through signals D0 through D7, as described above, the left hand portion of the signals labeled 2 through 7, illustrated in FIG. 6, are generated, and have leading edges occurring during the phase intervals W2 through W7, respectively.

The interval when the C signal is equal to 256 is illustrated in the eight rows in the bottom half of the table in FIG. 9, and the waveforms at the right side of FIG. 6. During this interval the signals D0 through D7 are formed in the following manner. If the medium resolution signal M is 0, then the signal D0 may assume any one of analog levels 0 through 7 (illustrated by multiple horizontal lines for signal D0 in FIG. 6). The particular analog level is derived from the signal A2 from the second DAC 266, represented by the entry "A2" in the column of the table of FIG. 9 representing signal D0 in the row representing a C signal of 256 and an M signal of 0. In the illustrated embodiment, the decoder 272 couples the output of the second DAC 266 to the D0 output terminal during this time interval. For C equal to 256 and M equal to 0, the signals D1 through D7 assume the analog level 0. The decoder 272 couples the source of an analog signal having the level 0 to the D1 through D7 output terminals. When the MUX 274 scans through signals D0 through D7, as described above, the right hand portion of the signal labeled "0" in FIG. 6 is generated, and the trailing edge occurs during the phase interval W0, in a manner to be described in more detail below.

If the medium resolution signal is equal to 1, the D0 signal is set to an analog value of 8. The signal D1 may assume analog levels 0 through 7 (signal A2 from the second DAC 266); and the remaining signals D2 through D7, assumes the analog value 0, as illustrated in FIG. 9. When the MUX 274 scans through signals D0 through D7, as described above, the right hand portion of the signal labeled "1" in FIG. 6 is generated, and the trailing edge occurs during the phase interval W1. Similarly, when the M signal has values 2 through 7, signals D2 through D7, respectively, have variable analog values 0 to 7 from signal A2 from the second DAC 266. Values of preceding Dx signals have analog values 8 and following Dx signals have analog values 0. When the MUX 274 scans through signals D0 through D7, as described above, the right hand portion of the signals labeled 2 through 7, illustrated in FIG. 6, are generated, and have trailing edges occurring during the phase intervals W2 through W7, respectively.

As described above, the analog MUX 274 couples the signals D0 through D7 from the decoder 272 to its output terminal D in order once each system clock cycle in response to the multiphase system clock signal. The signal D thus generated is low pass filtered and threshold detected, in a manner described below, to generate the clock output signal CLK OUT.

The fine resolution signal F from the adder 268 places the edge at a specified time within the specified phase interval W0 through W7 in the following manner. The fine resolution signal F is coupled to the first and second DACs, (DAC 1 264 and DAC 2 266) as described above. The table illustrated in FIG. 8 shows the respective output levels of the analog signals A1 and A2 provided by the first and second DACs, 264 and 266, corresponding to each value of the fine resolution signal F. That is, for a fine resolution signal F having a value of 0, the first DAC (DAC1) 264, generates an analog signal A1 having the level 1 and the second DAC (DAC2) 266 simultaneously generates an analog signal A2 having the level 7. For a fine resolution signal F having a value of 1, the first DAC generates an analog signal A1 having the level 2 and the second DAC generates an analog signal A2 having the level 6, and so forth.

FIG. 7 illustrates two possible waveforms for a selected signal D from the MUX 274. The topmost waveform D in FIG. 7 illustrates a selected waveform in which the value of the fine resolution signal F from the adder 268 is 6. As illustrated in the table of FIG. 8, the value of the A1 signal, thus, is 2 and the value of the A2 signal is 6. In the illustrated waveform D, the time locations of the A1 signal and the A2 signal are indicated by a series of thin horizontal lines, as in FIG. 6. The actual selected A1 and A2 signals in D are illustrated as thick lines. When this signal D is low pass filtered by the LPF 268, the resulting waveform is illustrated in the second waveform in FIG. 7.

Because the A1 level (2) is relatively low, compared with the maximum level (8) to which the filtered signal is rising, the filtered waveform rises relatively slowly. Consequently, the filtered waveform passes up through the threshold value Th (set in the illustrated embodiment halfway between the minimum and maximum values) relatively late in the A1 time interval. Similarly, because the A2 level (6) is relatively high, compared with the minimum level (0) to which the filtered waveform is falling, the filtered waveform falls relatively slowly. Consequently, the filtered waveform passes down through the threshold value Th relatively late in the A2 time interval.

The filtered waveform is compared to the threshold value Th in the comparator 278. When the value of the filtered waveform is less than the threshold value Th, the output of the comparator 278 is low, and when the value of the filtered waveform is greater than the threshold value Th, the output of the comparator 278 is high. The output of the comparator 278 is illustrated as the third waveform in FIG. 7, and is the clock output signal CLK OUT.

The fourth waveform D in FIG. 7 illustrates a selected waveform in which the value of the fine resolution signal from the interpolating filter 22 is 2. The value of the A1 signal, thus, is 6 and the value of the A2 signal is 2, as illustrated in the table of FIG. 8. The selected signal D is illustrated as a thick line. When this signal D is low pass filtered by the LPF 268, the resulting waveform is illustrated in the fifth waveform in FIG. 7.

Because the A1 level (6) is relatively high, compared with the maximum level (8) to which the filtered signal is rising, the filtered waveform rises relatively quickly. Consequently, the filtered waveform passes up through the threshold value Th relatively early in the A1 time interval. Similarly, because the A2 level (2) is relatively low, compared with the minimum level (0) to which the filtered waveform is falling, the filtered waveform falls relatively quickly. Consequently, the filtered waveform passes down through the threshold value Th relatively early in the A2 time interval.

The filtered waveform is compared to the threshold value Th in the comparator 278. The output of the comparator 278 is illustrated as the sixth waveform in FIG. 7, and is the clock output signal CLK OUT. As can be seen from FIGS. 6 and 7, the location of each edge may be placed with a resolution of 1/64th of the system clock period in response to the medium and fine resolution signals from the interpolating filter 22. In addition, the phase data signals from the preprocessor 5 are received at a lower rate than the baud, and are received synchronously at a fixed frequency, instead of at a rate dependent on the generated edges in the clock output signal CLK OUT.

One skilled in the art will understand that the signal at the least significant bit at the output terminal of the counter 262 represents a clock signal divided in frequency by 2 from the system clock signal at the input terminal of the counter 262. And each other bit output signal represents a clock signal divided in frequency by 2 from the next less significant bit. The counter 262, then, also can be thought of as representing a multibit frequency divider, such as represented by the frequency divider 232 in the interpolator filter 22. For this reason, a single counter 262 is used in the illustrated embodiment with the output terminals coupled to both the adder 268 in the phase modulator 26 and the clock selector 234 in the interpolation filter 22. (The clock selector 234 also receives the undivided system clock signal from the PLL 14.) Because the interpolation filter 22 shares the clock divider 232 with the counter 262 in the phase modulator 26, it is shown in phantom in the interpolation filter 22.

Figure 11:
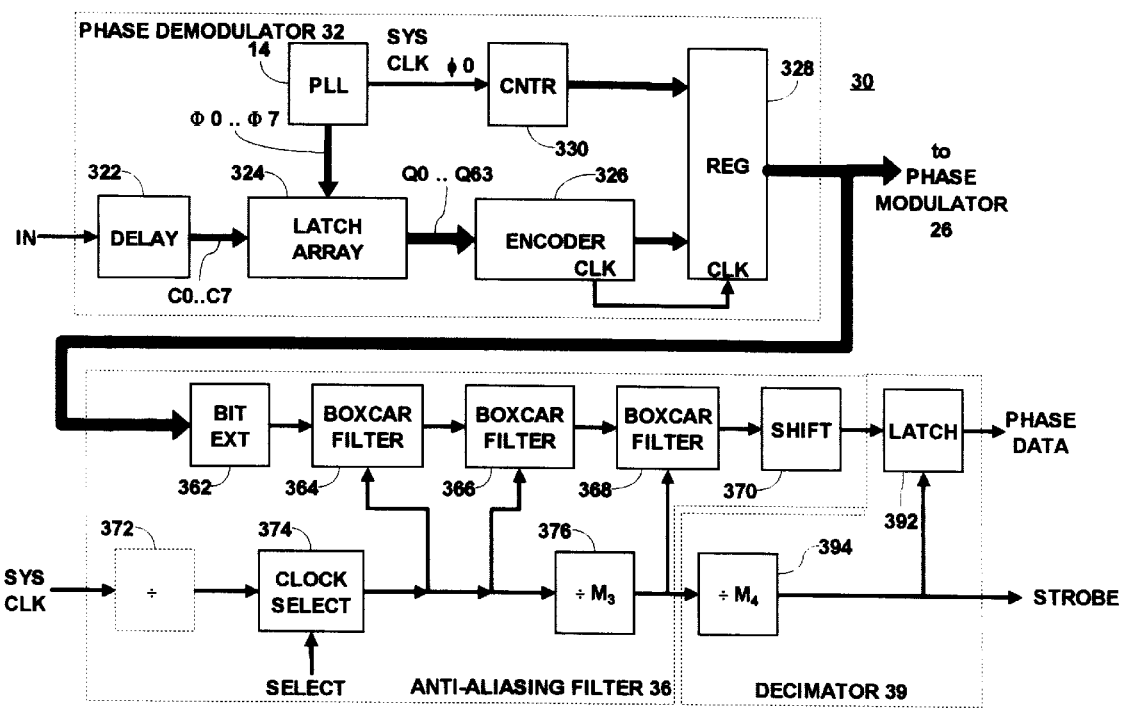
FIG. 11 is a more detailed block diagram of a serial binary input signal analyzer as illustrated in FIG. 10.

Referring now to the digital phase analyzer illustrated in FIG. 1b, FIG. 11 is a block diagram of a clock signal analyzer which may be used in the system 10 illustrated in FIG. 1. In FIG. 11, the input terminal IN is coupled to a source of an serial binary input signal. The input terminal IN is coupled to an input terminal of a phase demodulator 32. And output terminal of the phase demodulator 32 is coupled to an input terminal of an anti-aliasing filter 36. An output terminal of the anti-aliasing filter 36 is coupled to an input terminal of a decimator 39. A data output terminal of the decimator 39 produces data representing the phase characteristic of the serial binary input signal at the input terminal IN, and is coupled to an output terminal PHASE DATA. A strobe output terminal from the decimator 39 is coupled to a strobe output terminal STROBE.

The serial binary input signal at the input terminal IN has edges occurring at time locations corresponding nominally to the baud. This serial binary input signal can be a phase modulated signal in which the locations of the edges vary in phase, or the signal could be a data carrying signal in which such edges are either present or absent, representing the value of the data being carried by the signal. In the case of a data carrying signal, the edges which occur will occur substantially at the baud.

The phase demodulator 32 generates edge location data specifying the location of each edge in the serial binary input signal. The edge location data is generated at the time each edge is detected and corresponds to the edge placement data described above with reference to the clock synthesizer 20. The decimator 39 produces one sample, representing the phase characteristics of the serial binary input signal, every predetermined number of edge location samples in synchronism with the system clock, and asynchronously with the occurrences of the edges. The anti-aliasing filter 36 prevents aliasing in the decimation process, in a known manner.

In addition, referring again to FIG. 11, a phase modulator 26, constructed as illustrated in FIG. 3 and operating as described above, optionally has an input terminal coupled to the output terminal of the demodulator 32, as shown in phantom in FIG. 11. The output terminal of the phase modulator 26 is coupled in phantom to an output terminal producing a recovered clock output signal. As described above, with reference to FIG. 3, the phase modulator receives edge placement data and generates an clock output signal CLK OUT in response to that edge placement data. The phase demodulator 32 generates edge location data related to the received serial binary input signal from the input terminal IN, and this edge location data corresponds to the edge placement data received from the interpolating filter 22 of FIG. 3. In response to this data, the phase modulator 26 can generate a recovered clock output signal having a phase which corresponds to the received edge location data, which in turn, corresponds to the received serial binary input signal at the input terminal IN.

Figure 10:
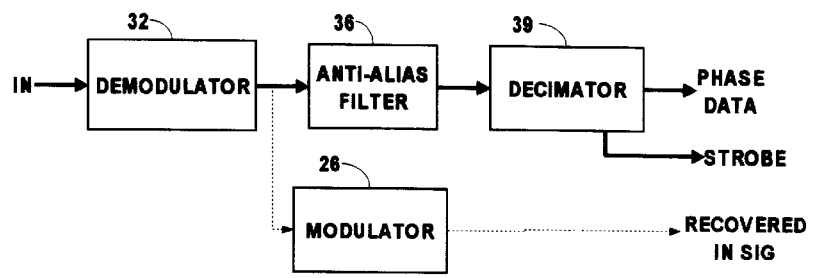
FIG. 10 is a block diagram of a serial binary input signal analyzer which may be used in the system illustrated in FIG. 1.

FIG. 10 is a more detailed block diagram of a phase analyzer 30 illustrated in FIGS. 1 and 11. In FIG. 10, an input terminal IN is coupled to the source of the serial binary input signal. The input terminal IN is coupled to an input terminal of a delay circuit 322. An output terminal of the delay circuit 322 is coupled to a data input terminal of a latch array 324. An output terminal of the latch array 324 is coupled to an input terminal of a binary encoder 326. A data output terminal of the binary encoder 326 is coupled to a first input terminal of a register 328. An output terminal of the register 328 is coupled to the anti-aliasing filter 36 and to the phase modulator 26.

The system clock signal SYS CLK, which is Φ0 of the multiphase system clock signal, is coupled to an input terminal of a counter 330. An output terminal of the counter 330 is coupled to a second input terminal of the register 328. The combination of the delay circuit 322, the latch array 324, the binary encoder 326, the counter 330 and the register 328 form the phase demodulator 32.

The output terminal of the register 328 is coupled to an input terminal of a bit extender 362. An output terminal of the bit extender is coupled to a data input terminal of a first boxcar filter 364. An output terminal of the first boxcar filter 364 is coupled to a data input terminal of a second boxcar filter 366. An output terminal of the second boxcar filter is coupled to a data input terminal of a third boxcar filter 368. An output terminal of the third boxcar filter 368 is coupled to an input terminal of a barrel shifter 370. An output terminal of the barrel shifter 370 is coupled to an input terminal of a latch 392. The latch 392 generates the phase representative data describing the phase characteristics of the serial binary input signal, and is coupled to a output terminal PHASE DATA.

The system clock signal SYS CLK from the PLL 14 is also coupled to an input terminal of a frequency divider 372. An output terminal of the frequency divider 372 is coupled to an input terminal of a clock selector 374. An output terminal of the clock selector 374 is coupled to an input terminal of a first fixed frequency divider 376 and respective clock input terminals of the first and second boxcar filters, 364 and 366. An output terminal of the first fixed frequency divider 376 is coupled to an input terminal of a second fixed frequency divider 394 and to a clock input terminal of the third boxcar filter 368. An output terminal of the second fixed frequency divider 394 is coupled to a clock input terminal of the latch 392. The combination of the bit extender 362, the first, second and third boxcar filters 364, 366 and 368 respectively, the barrel shifter 370, the clock divider 372, the clock selector 374, and the first fixed frequency divider 376 form the anti-aliasing filter 36. The combination of the latch 392 and the second fixed frequency divider 394 form the decimator 39.

In operation, the combination of the delay circuit 322, the latch array 324 and the binary encoder 326 operate to detect an edge in the serial binary input signal at the input terminal IN, in a manner to be described in more detail below. When an edge is detected, the binary encoder generates a signal at its clock output terminal which conditions the register 328 to latch the data at the respective data output terminals of the counter 330 and binary encoder 326. The counter 330 counts cycles of the system clock SYS CLK. Consequently, the value of the count latched in the register 328 represents the integer number of system clock cycles since the previously detected edge. This provides a coarse indication of the edge location.

Figure 12:
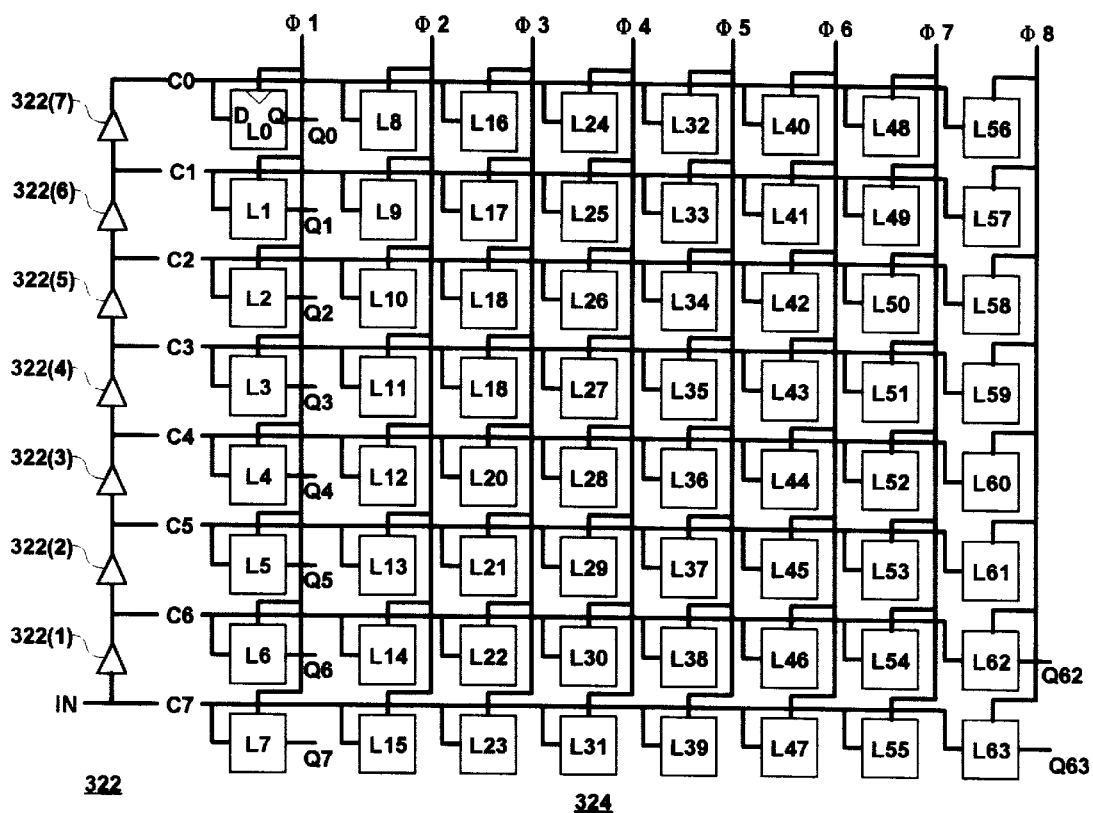
FIG. 12 is a more detailed block diagram of a delay and latch array circuit as illustrated in FIG. 11.

FIG. 12 is a more detailed block diagram of a delay circuit 322 and latch array circuit 324 as illustrated in FIG. 10. In FIG. 12, the latch array 324 consists of an array of eight rows of latches, each row containing eight latches, each latch being a D flip-flop, and each D flip-flop having a D input terminal, a clock input terminal (designated by a small triangle) and a Q output terminal (illustrated only for the latch L0 in the top left of the latch array 324). The total of 64 flip-flops forms an array having eight rows and eight columns.

The Φ1 clock signal is coupled in common to the clock input terminals of the eight D flip-flops in the first (leftmost) column. These latches are designated, from the top row to the bottom row, L0 to L7. The output terminals from these latches are coupled to output terminals Q0 through Q7, respectively, of the latch array 324. The Φ2 clock signal is coupled in common to the clock input terminals of the eight flip-flops in the second column. These latches are designated, from the top row to the bottom row, L8 to L15. The output terminals from these latches are coupled to output terminals Q8 through Q15, respectively (not shown to simplify the drawing). The Φ3 clock signal is coupled in common to the clock input terminals of the eight flip-flops in the third column. These latches are designated, from the top row to the bottom row, L16 to L23. The output terminals from these latches are coupled to output terminals Q16 through Q23, respectively (not shown to simplify the drawing). The Φ4 clock signal is coupled in common to the clock input terminals of the eight f lip-flops in the fourth column. These latches are designated, from the top row to the bottom row, L24 to L31. The output terminals from these latches are coupled to output terminals Q24 through Q31, respectively (not shown to simplify the drawing). The Φ5 clock signal is coupled in common to the clock input terminals of the eight flip-flops in the fifth column. These latches are designated, from the top row to the bottom row, L32 to L39. The output terminals from these latches are coupled to output terminals Q32 through Q39, respectively (not shown to simplify the drawing). The Φ6 clock signal is coupled in common to the clock input terminals of the eight flip-flops in the sixth column. These latches are designated, from the top row to the bottom row, L40 to L47. The output terminals from these latches are coupled to output terminals Q40 through Q47, respectively (not shown to simplify the drawing). The Φ7 clock signal is coupled in common to the clock input terminals of the eight flip-flops in the seventh column. These latches are designated, from the top row to the bottom row, L48 to L55. The output terminals from these latches are coupled to output terminals Q48 through Q55, respectively (not shown to simplify the drawing). The Φ0 clock signal is coupled in common to the clock input terminals of the eight flip-flops in the eighth (rightmost) column. These latches are designated, from the top row to the bottom row, L56 to L63. The output terminals from these latches are coupled to output terminals Q56 through Q63, respectively (only Q62 and Q63 shown to simplify the drawing).

The input terminal IN is coupled to an input terminal of a serial connection of a first delay circuit 322(1), a second delay circuit 322(2), a third delay circuit 322(3), a fourth delay circuit 322(4), a fifth delay circuit 322(5), a sixth delay circuit 322(6), and a seventh delay circuit 322(7). The combination of the first delay circuit 322(1), the second delay circuit 322(2), the third delay circuit 322(3), the fourth delay circuit 322(4), the fifth delay circuit 322(5), the sixth delay circuit 322(6), and the seventh delay circuit 322(7) form the delay circuit 322.

An output terminal of the seventh delay circuit 322(7) forms the C0 input signal to the latch array 324 and is coupled in common to the input terminals D of the first (topmost) row of latches (L0, L8, L16, L24, L32, L40, L48 and L56). An output terminal of the sixth delay circuit 322(6) forms the C1 input signal to the latch array 324 and is coupled in common to the input terminals D of the second row of latches (L1, L9, L17, L25, L33, L41, L49 and L57). An output terminal of the fifth delay circuit 322(5) forms the C2 input signal to the latch array 324 and is coupled in common to the input terminals D of the third row of latches (L2, L10, L18, L26, L34, L42, L50 and L58). An output terminal of the fourth delay circuit 322(4) forms the C3 input signal to the latch array 324 and is coupled in common to the input terminals D of the fourth row of latches (L3, L11, L19, L27, L35, L43, L51 and L59). An output terminal of the third delay circuit 322(3) forms the C4 input signal to the latch array 324 and is coupled in common to the input terminals D of the fifth row of latches (L4, L12, L20, L28, L36, L44, L52 and L60). An output terminal of the second delay circuit 322(2) forms the C5 input signal to the latch array 324 and is coupled in common to the input terminals D of the sixth row of latches (L5, L13, L21, L29, L37, L45, L53 and L61). An output terminal of the first delay circuit 322(1) forms the C6 input signal to the latch array 324 and is coupled in common to the input terminals D of the seventh row of latches (L6, L14, L22, L30, L38, L46, L54 and L62). The input terminal IN forms the C7 input signal to the latch array 324 and is coupled in common to the input terminals D of the eighth row of latches (L7, L15, L23, L31, L39, L47, L54 and L63).

Figure 13:
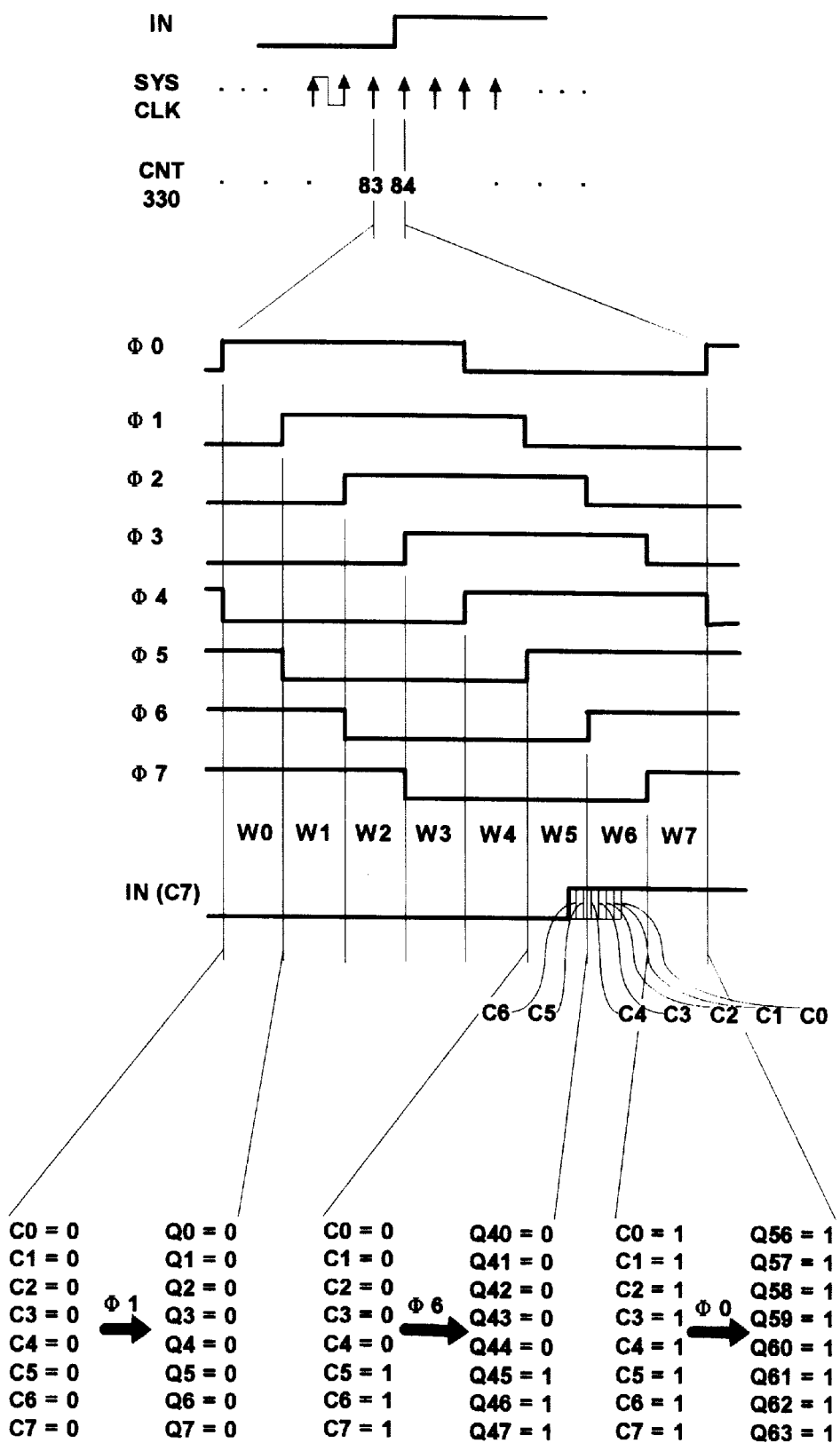
FIG. 13 is a waveform diagram useful in understanding the operation of the serial binary input signal analyzer illustrated in FIGS. 11 and 12.

The operation of the demodulator 32 of FIG. 10, and in particular the delay circuit 322 and latch array 324 of FIG. 12 may be better understood by reference to the waveform diagram illustrated in FIG. 13. In FIG. 13, the topmost waveform is a portion of the serial binary input signal IN, showing a rising edge. The second waveform shows the leading edges of the system clock signal SYS CLK, which, as described above, is phase Φ0 of the multiphase system clock signal. The counter 330 (of FIG. 10) increments its count at each rising edge of the system clock signal SYS CLK. In the illustrated waveform, the rising edge of the serial binary input signal IN occurs after the counter 330 takes the value 83, and before it is incremented to 84. As described above, the combination of the delay circuit 322, the latch array 324 and the binary encoder 326 detects the edge, and conditions the register 328 to latch the value of the counter 330 upon detection of an edge. In the illustrated waveforms, the register 328 latches the value 83.

The next eight waveforms represent the multiphase system clock signal. These signals define eight phase intervals, W0 through W7, all as described in more detail above. The next waveform is the serial binary input signal IN (which is also the signal C7 supplied to the latch array 324) in greater resolution. The rising edge occurs approximately three-quarters of the way through the phase interval W5.

In operation, each of the delay circuits 322(x) is designed to provide a fixed delay of 1/64th of the system clock SYS CLK signal. The serial binary input signal IN is passed through the serial connection of delay circuits 322(1) through 322(7) to form a set of delayed signals C0 through C7. The latches L0 through L7 receive signals C0 through C7, respectively, and are clocked by the phase Φ1 signal. The latches L0 through L7, thus, latch the eight delayed signals C0 through C7 at the rising edge of the phase Φ1 signal, and produce latched signals at output terminals Q0 through Q7, respectively. In the illustrated waveforms, these signals are all logical '0' signals. The latches L8 through L15 are clocked by the Φ2 signal, latch the eight delayed signals C0 through C7 at the rising edge of the Φ2 signal, and produce the latched signals at the output terminals Q8 through Q15, respectively (not shown), and so forth. Shown specifically, the latches L40 through L47 latch the eight delayed signals C0 through C7 taken at the rising edge of the phase Φ6 signal, and produce the latched signals at the output terminals Q40 through Q47, respectively. The values of these samples will be discussed below. The latches L56 through L63 latch the eight delayed signals C0 through C7 at the rising edge of the phase Φ0 signal, and produce the latched signals at the output terminals Q40 through Q47, respectively. These signals are all logical '1' signals.

The C7 signal is illustrated as a thick line in FIG. 13. The C6 through C0 signals, each delayed by 1/64 of the system clock period with respect to the preceding signal, are illustrated by thin lines in FIG. 13. At the rising edge of the phase Φ6 signal, the rising edge of the serial binary input signal IN, which is the C7 signal, has already occurred. Thus, the C7 signal is a logical '1' signal. Thus, latch L47, receiving the C7 signal, latches a logical '1' signal, and produces a Q47 output signal which is a logical '1' signal. Similarly, at the rising edge of the phase Φ6 signal, the rising edge of the C6 and C5 signals have also occurred. Thus, latches L46 and L45, receiving the C6 and C5 delayed signals, latch logical '1' signals, and produce Q46 and Q45 output signals which are logical '1' signals, respectively.

Conversely, the C4 delayed signal at the rising edge of the phase Φ6 signal, the rising edge of the C4 delayed signal has not yet occurred. Thus, latch L44, receiving the C4 delayed signal, latches a logical '0' signal, and produces a Q44 output signal which is a logical '0' signal. Similarly, at the rising edge of the phase Φ6 signal, the rising edge of the C3 and C0 signals have also not yet occurred. Thus, latches L43 through L40, receiving the C3 through C0 delayed signals, latch logical '0' signals, and produce Q43 through Q40 output signals which are logical '0' signals, respectively.

The binary encoder 326 processes the Q0 through Q63 signals to detect edges. If the logical value of all the Q0 through Q63 signals are the same (i.e. either all logical '1' signals or all logical '0' signals) then 'no edge' is detected. This would be the case for the system clock interval either preceding or following the system clock interval for which the count in counter 330 is 83. Referring to the top three waveforms in FIG. 13, for the preceding system clock interval, the Q0 through Q63 signals are all logical '0' signals and for the following system clock interval the Q0 through Q63 signals are all logical '1' signals. In this case, no clock signal is produced at the clock output terminal of the binary encoder 326.

If, however, two adjacent Q signals have different logical values, then an edge is detected by the binary encoder 326. In the waveforms illustrated in FIG. 13, during the system clock interval where the counter has the value 83, the signal Q44 has a logical '0' value and the signal Q45 h as a logical '1' value. This represents a leading edge. In a similar manner, a trailing edge would be detected if a signal Qn has a logical '1' value and the signal Qn+1 has a logical '0' value. In either case, a multibit binary signal having the value of the number of the Q signal just before the change in logical value is supplied to the register 328 by the binary encoder 326 and a clock signal is supplied to the register 328.

In the illustrated embodiment, a six-bit binary signal having the value 44 is supplied to the register 328. The register 328, in response to the clock signal from the binary encoder 326, latches the value of the counter 330 (representing the number of complete clock cycles since the last detected edge) and the value from the encoder 326 (representing the fractional location of the edge within the current system clock cycle). In the illustrated embodiment, the output from the register 328 is a 15 bit digital signal. In a preferred embodiment, the register 328 operates in a synchronous manner, receiving the system clock SYS CLK signal at a clock input terminal, and the clock output signal from the binary encoder 326 at a latch enable input terminal.

One skilled in the art will understand that the edge detection function in the binary encoder 326 may be provided by calculating the exclusive-OR of Qn and Qn+1 (Qn⊕Qn+1) for all n. If (Qn⊕Qn+1)=0 for all n (i.e. if all the signals have the same logical value), then no edge is detected and no clock signal is generated for the register 328. If (Qn⊕Qn+1)=1 (i.e. Qn is different from Qn+1) for any n, then the binary encoder 326 produces a value of n at the data output terminal, and generates a clock signal for the register 328.

In the illustrated embodiment, eight delayed signals are supplied to eight respective rows of latches, and eight columns of latches receive eight respective phase signals from the multiphase system clock to produce a detection resolution of 1/64 of the system clock period. One skilled in the art will understand that other arrangements are possible. For example, 16 delay circuits exhibiting delays of 1/128 of the system clock period could be supplied to 16 respective rows of latches, and eight columns of latches receive eight respective phase signals from the multiphase system clock to produce a detection resolution of 1/128 of the system clock period. Or, eight delay circuits exhibiting delays of 1/128 of the system clock period could be supplied to eight respective rows of latches, and 16 columns of latches receive 16 respective phase signals from the multiphase system clock to produce a detection resolution of 1/128 of the system clock period. Or, 16 delay circuits exhibiting delays of 1/256 of the system clock period could be supplied to 16 respective rows of latches, and 16 columns of latches receive 16 respective phase signals from the multiphase system clock to produce a detection resolution of 1/256 of the system clock period.

The edge location data from the register 328, occurring for each detected edge, is available for use by other circuit elements. For example, in the illustrated embodiment, the edge location data is supplied to the phase modulator 26, which generates a recovered serial binary signal based on that data. Other functions could be performed in response to that data as well.

The edge location data from the register 328 is also supplied to the anti-aliasing filter 36. As described above, with respect to the interpolating filter 22 (of FIG. 3), the combination of the divider 372 and the clock selector 374 operate to select a clock frequency for the anti-aliasing filter 36, either at the system clock frequency or a submultiple of the system clock frequency. Also as described above, the counter 330, coupled to the system clock, provides the clock divider function of the divider 372.

The selected clock signal from the clock selector 374 provides a clock signal for the first and second boxcar filters. This signal is also divided in frequency by a factor $M_3$ in the first fixed frequency divider 376 and then again by a factor of $M_4$ in the second fixed frequency divider 394. The output clock signal from the first fixed frequency divider 376 provides the clock signal for the third boxcar filter 368, and the output clock signal from the second fixed frequency divider 394 provides the clock signal for the latch 392.

The anti-aliasing filter 36 consists of a series connection of a first-order low pass filter and bit extender 362, and three boxcar filters 364, 366 and 368, each of which averages input samples over a predetermined time window. The bit extender 362 is implemented as a first order LPF. In the illustrated embodiment, it is implemented as an IIR filter, in a known manner. In addition, the bit extender 362 extends the number of bits in its output signal to 23 bits from the 15 bits available from the register 328. The serial connection of the first and second boxcar filters 364 and 366 operate to average M samples at the selected filter clock frequency from the clock selector 374. The third boxcar filter 368 operates to average M samples at the selected filter clock frequency divided by the fixed factor $M_3$. The output signal from the third boxcar filter 368 is a low pass filtered version of the series of edge location data signals from the register 328. The filtering prevents aliasing artifacts from occurring during the decimation process, in a known manner. As described above, the barrel shifter 370 shifts the filtered phase data signal to account for gain changes introduced by the low pass filtering boxcar filters. The latch 392 latches one output phase data signal out of every M edge location data samples from the register 328, where $M=M_3 \cdot M_4$. These output phase data samples are provided to the post processor 25 (of FIG. 1), and the clock signal to the latch 392 operates as the strobe signal for the post processor 25.

Figure 14:
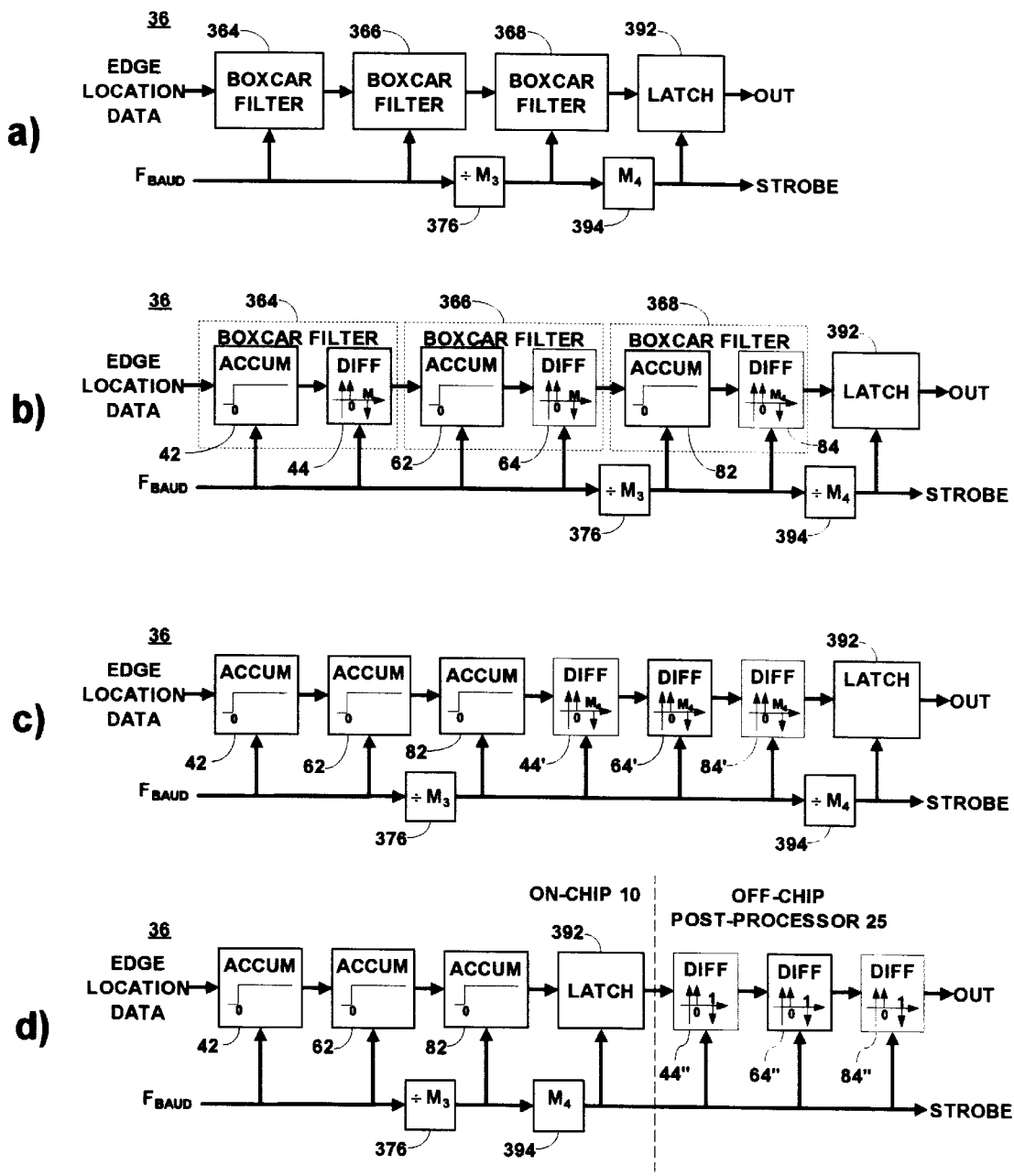
FIG. 14 including

As described above, it is possible for some of the signal processing described above to be shared with the preprocessor 5, in the case of the clock output signal synthesizer, or with the post processor 25 in the case of the serial binary input signal analyzer. FIG. 14 is a more detailed block diagram of the anti-aliasing filter 36 illustrated in FIG. 10, though the technique illustrated in FIG. 14 may be applied equally well to the interpolation filter illustrated in FIG. 3.

FIG. 14 consists of four block diagrams of respective arrangements for the anti-aliasing filter 36 of FIG. 10. FIG. 14a is a simplified block diagram of the anti-aliasing filter 36 as illustrated in FIG. 10. In FIG. 14a, a serial connection of the first, second and third boxcar filters, 364, 366 and 368, are coupled between the source of the edge location data signal and a latch 392. The first and second boxcar filters, 364 and 366 are clocked by a clock signal at the baud $F_{BAUD}$. The third boxcar filter 368 is clocked by a clock signal at $F_{BAUD}/M_3$. The latch 392 is clocked by a clock signal at $F_{BAUD}/M$, where $M=M_3 \cdot M_4$, which also is the strobe signal STROBE.

As is well known, the averaging function may be considered as a combination of an accumulation function, which is a relatively high speed operation, and a differencing function, which may be a relatively low speed operation. FIG. 14b shows each of the first, second and third boxcar filters, 364, 366 and 368, decomposed into the serial connection of an accumulator and differencer circuit, all in a known manner. The first boxcar filter 364 includes the serial connection of an accumulator 42 and differencer 44; the second boxcar filter 366 includes the serial connection of an accumulator 62 and a differencer 64; and the third boxcar filter 368 includes the serial connection of an accumulator 82 and a differencer 84. Because the accumulating and differencing processes are linear processes, the accumulators 42, 62 and 82 and the differencers 44, 64 and 84 may be connected in any order in the serial connection.

FIG. 14c is a different arrangement in which the three accumulators 42, 62 and 82 are connected in front of the three differencers 44', 64' and 84'. In FIG. 14c, the first and second accumulators 42 and 62 are clocked by a clock signal at the baud $F_{BAUD}$ and the third accumulator 82 is clocked by a clock signal at a rate of $F_{BAUD}/M_3$. The three differencers 44', 64' and 84' are all clocked by a clock signal at a rate of $F_{BAUD}/M_3$.

FIG. 14d is another arrangement in which the latch 392 is placed between the serial connection of the three accumulators 42, 62 and 82, and the three differencers 44", 64" and 84". In FIG. 14d, the latch 392 and the three differencers 44", 64" and 84" are all clocked by a clock signal at a rate of $F_{BAUD}/M$. This arrangement groups the differencer circuits 44", 64" and 84" at the end of the signal processing chain, which is operating at the relatively low speed of $F_{BAUD}/M$. In the illustrated embodiment, the three accumulators 42, 62 and 82, and the latch 392 are fabricated on the semiconductor chip containing the system 10, while the differencers 44", 64" and 84" are fabricated off the chip, and are in the post processor 25 of FIG. 10.

The boxcar filters 224 and 226 in the interpolation filter 22 illustrated in FIG. 3 may be similarly decomposed into accumulators and differencers and rearranged so that the differencers may be fabricated off the integrated circuit chip in the preprocessor 5. Such rearranging of the processing disclosed in the present application does not change the functions described above, but moves relatively low speed processing off the chip, decreasing the circuitry which needs to be fabricated on an integrated circuit chip. This decreases the cost of such a chip, and any equipment using such a chip.

Figure 15:
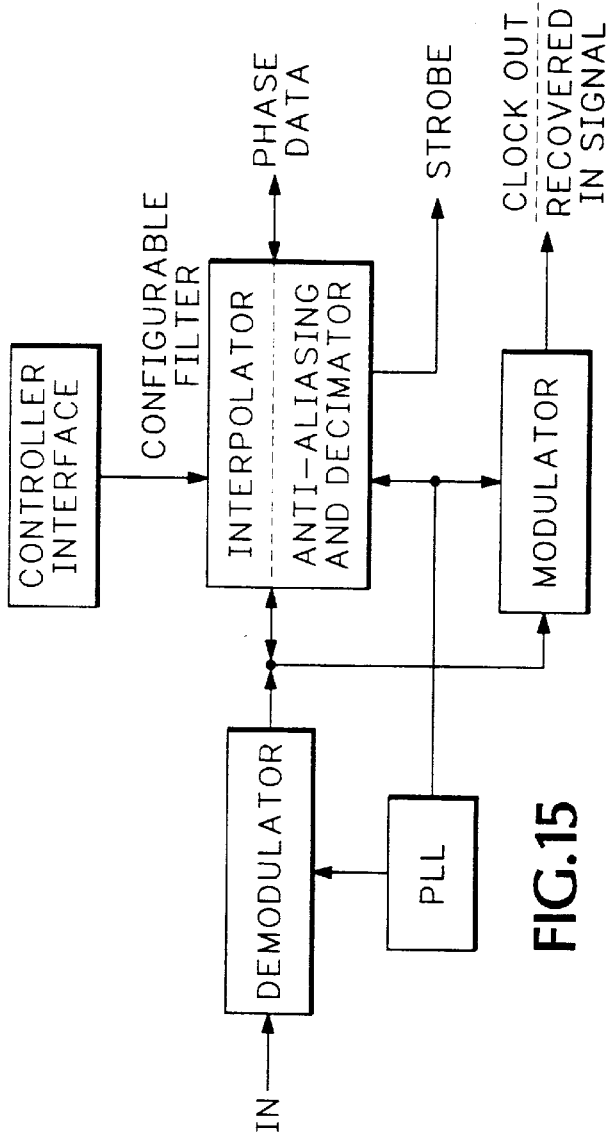
FIG. 15 is a block diagram of a digital phase analyzer and synthesizer according to the present invention.
Figure 16:
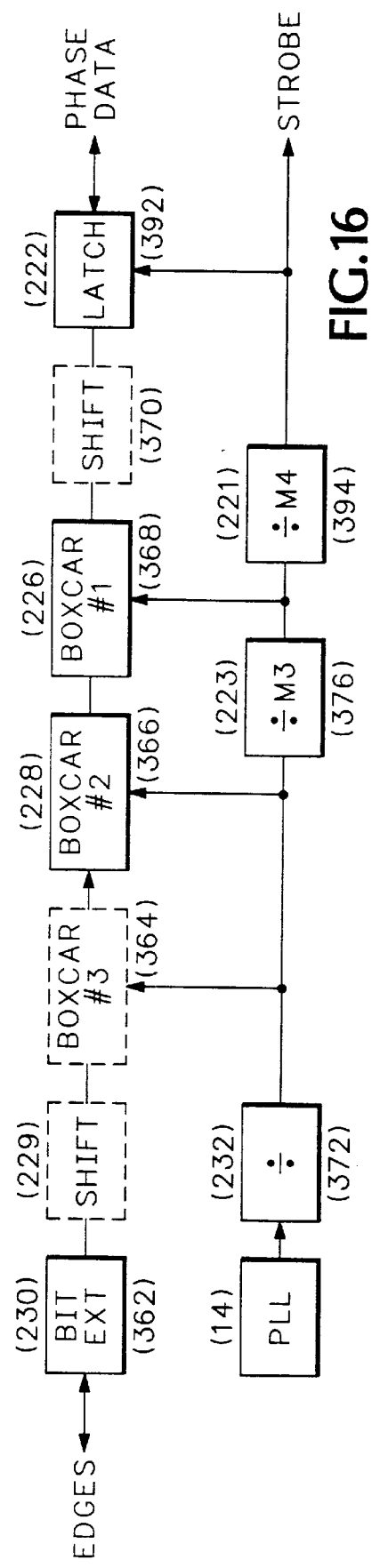
FIG. 16 is a block diagram illustrating a configurable filter that may perform either as an interpolator or an anti-aliasing filter/decimator according to the present invention.

Comparing the interpolation filter 22 of FIGS. 3 and 5 to the anti-aliasing filter 36 of FIG. 10, it may be seen that many of the same elements are shared in both filters. For example, the serial connection of the PLL 14, clock frequency divider (232 and 372), clock selector (234 and 374), first fixed frequency divider (223 and 376) and second fixed frequency divider (221 and 394) appear in both the interpolation filter 22 and anti-aliasing filter 36. The remaining elements: first boxcar filter (226 and 368), second boxcar filter (228 and 366) and third boxcar filter 364; the bit extender (230 and 362); the barrel shifter (229 and 370); and the latch (222 and 392); may be electrically rearranged by switching data and clock input terminals to the appropriate output terminals of corresponding other elements using any of the techniques known to one skilled in the art, as shown in FIG. 15. Similarly, the input terminal of the phase modulator 26 may be electrically switched between the output of the interpolator 22 when the system is operating as a clock signal synthesizer, to the output of the phase demodulator 32 when the system is operating as a clock signal analyzer, as shown in FIG. 15. Referring to FIG. 1, the operating modes may be controlled by a control signal supplied from the system controller (not shown) to the system 10 via the control interface 12. The control interface 12 would supply the appropriate control signals to the switching elements to couple the illustrated elements in the desired manner.

The serial binary signal synthesizer as described above, receives phase representative data synchronously with a fixed frequency system clock, and a serial binary signal analyzer generates phase representative data synchronously with a fixed frequency system clock. Such a system, operating synchronously, is easy to use as a part of a measurement instrument. In addition, the digital filtering necessary in such a system, that is the interpolation filter and anti-aliasing filter, is easier to design and implement. Furthermore, it may be understood that the serial binary signal analyzer can operate on a data signal, one in which edges may be present or absent, without requiring a separate clock recovery circuit.

What is claimed is:

1. A clock output signal synthesizer, comprising:
    an interpolator coupled to receive phase data specifying a predetermined phase characteristic of a clock output signal, the phase data being in synchronism with a system clock signal, for generating edge placement data signals in response to the phase data; and
    a phase modulator coupled to the interpolator for generating the clock output signal having edges placed at times determined by each of the edge placement data signals responsive to the system clock signal.

2. A serial binary input signal analyzer, comprising:
    a phase demodulator coupled to receive a serial binary input signal for continually generating edge location data signals representing where the serial binary input signal transitions between states;
    a decimator coupled to the phase demodulator through an anti-aliasing filter for generating phase data from the edge location data signals in synchronism with a system clock signal.

3. The analyzer of claim 2, further comprising a phase modulator coupled to the phase demodulator for generating a recovered clock output signal from the edge location data signals, the recovered clock output signal having the same phase as the serial binary input signal.

4. A system comprising:
    a source of a system clock signal;
    a controller interface;
    a phase modulator;
    a phase demodulator; and
    a configurable filter coupled to receive the system clock signal from the source and commands from the controller interface, and also coupled to the phase modulator and the phase demodulator; wherein:
    the system is configured in response to the commands from the controller interface to operate in a first operating mode in which:
        the configurable filter is configured to operate as an interpolator coupled to receive phase data specifying a predetermined phase characteristic of a clock output signal, the phase data being in synchronism with the system clock signal, for generating edge placement data signals in response to the phase data; and
        the phase modulator is coupled to the configurable filter to receive the edge placement data signals for generating the clock output signal having edges placed at times determined by each of the edge placement data signals responsive to the system clock signal; and
    the system is configured in response to the commands from the controller interface to operate in a second operating mode in which:
        the phase demodulator is coupled to receive a serial binary input signal for continually generating edge location data signals representing state transitions of the serial binary input signal responsive to the system clock signal; and
        the configurable filter is configured to operate as an anti-aliasing filter/decimator coupled to the phase demodulator to receive the edge location data signals for generating phase data from the edge location data signals in synchronism with the system clock signal.

5. The system of claim 4 wherein in the second configuration the phase modulator is coupled to the phase demodulator to generate a recovered clock output signal from the edge location data signals, the recovered clock output signal having the same phase as the serial binary input signal.

* * * * *